(12) United States Patent
Tsai et al.

(10) Patent No.: US 8,023,613 B2
(45) Date of Patent: Sep. 20, 2011

(54) SHIFT REGISTER CIRCUIT AND GATE SIGNAL GENERATION METHOD THEREOF

(75) Inventors: Tsung-Ting Tsai, Hsin-Chu (TW); Yung-Chih Chen, Hsin-Chu (TW)

(73) Assignee: Au Optronics Corp., Science-Based Industrial Park, Hsin-Chu (TW)

( * ) Notice: Subject to any disclaimer, the term of this patent is extended or adjusted under 35 U.S.C. 154(b) by 16 days.

(21) Appl. No.: 12/649,341

(22) Filed: Dec. 30, 2009

(65) Prior Publication Data

US 2011/0058642 A1 Mar. 10, 2011

(30) Foreign Application Priority Data

Sep. 7, 2009 (TW) .............................. 98130128 A

(51) Int. Cl.
*G11C 19/00* (2006.01)
(52) U.S. Cl. .......................................... 377/79; 377/64
(58) Field of Classification Search .................... 377/64, 377/78, 79
See application file for complete search history.

(56) References Cited

U.S. PATENT DOCUMENTS

| | | | |
|---|---|---|---|
| 7,310,402 B2 | 12/2007 | Wei | |
| 7,319,452 B2 | 1/2008 | Moon | |
| 7,342,568 B2 * | 3/2008 | Wei et al. | ...................... 345/100 |
| 2007/0035505 A1 * | 2/2007 | Lin et al. | ........................ 345/100 |
| 2008/0055225 A1 * | 3/2008 | Pak et al. | .......................... 345/96 |
| 2009/0304139 A1 * | 12/2009 | Tsai et al. | ........................ 377/79 |
| 2010/0150303 A1 * | 6/2010 | Tsai et al. | ........................ 377/79 |
| 2010/0260312 A1 * | 10/2010 | Tsai et al. | ........................ 377/79 |
| 2011/0002437 A1 * | 1/2011 | Su et al. | ........................... 377/64 |
| 2011/0013740 A1 * | 1/2011 | Lin et al. | .......................... 377/79 |
| 2011/0044423 A1 * | 2/2011 | Lin et al. | .......................... 377/64 |

\* cited by examiner

*Primary Examiner* — Lincoln Donovan
*Assistant Examiner* — Ryan C Jager
(74) *Attorney, Agent, or Firm* — Winston Hsu; Scott Margo

(57) ABSTRACT

A shift register circuit includes a plurality of shift register stages for providing plural gate signals to plural gate lines. Each shift register stage includes an input unit, a first pull-up unit, a second pull-up unit, a pull-down unit and an auxiliary pull-down unit. The input unit inputs a first gate signal generated by a preceding shift register stage to become a driving control voltage. The first pull-up unit pulls up a second gate signal according to the driving control voltage and a first clock signal. The second pull-up unit pulls up a third gate signal according to the driving control voltage and a second clock signal. The auxiliary pull-down unit is employed to pull down the driving control voltage according to a fourth gate signal generated by a subsequent shift register stage. The pull-down unit pulls down the first and second gate signals according to the driving control voltage.

26 Claims, 13 Drawing Sheets

SHIFT REGISTER CIRCUIT AND GATE SIGNAL GENERATION METHOD THEREOF

BACKGROUND OF THE INVENTION

1. Field of the Invention

The present invention relates to a shift register circuit and gate signal generation method thereof, and more particularly, to a Shift register circuit having simplified architecture and gate signal generation method thereof.

2. Description of the Prior Art

Along with the advantages of thin appearance, low power consumption, and low radiation, liquid crystal displays have been widely applied in various electronic products for panel displaying. The operation of a liquid crystal display is featured by varying voltage drops between opposite sides of a liquid crystal layer for twisting the angles of the liquid crystal molecules in the liquid crystal layer so that the transmittance of the liquid crystal layer can be controlled for illustrating images with the aid of the light source provided by a backlight module.

In general, the liquid crystal display comprises plural pixel units, a gate driver, and a source driver. The source driver is utilized for providing plural data signals to be written into the pixel units. The gate driver comprises a shift register circuit which is employed to generate plural gate signals for controlling the operations of writing the data signals into the pixel units. That is, the shift register circuit is a crucial device for providing a control of writing the data signals into the pixel units.

FIG. 1 is a schematic diagram showing a prior-art shift register circuit 100. As shown in FIG. 1, the shift register circuit 100 includes a plurality of shift register stages 120. Each shift register stage 120 comprises an input unit 125, a pull-up unit 130, a first control unit 135, a first pull-down unit 140, a second control unit 145, a second pull-down unit 150 and an auxiliary pull-down unit 160. Each shift register stage 120 is employed to generate a corresponding gate signal according to a first clock CK1 and a second clock CK2 in conjunction with the gate signal generated by a preceding shift register stage 120. The gate signals generated by the shift register circuit 100 are furnished to the pixel units 103 of a pixel array 101 for providing a control of writing operations over the data signals of a gate line DLi. However, regarding the operation of the shift register circuit 100, each shift register stage 120 is used only to generate a corresponding gate signal, and therefore the circuit structure of the shift register circuit 100 is quite complicated. For that reason, how to provide a shift register circuit having simplified architecture so as to bring the cost down has become one of the most important topics nowadays.

SUMMARY OF THE INVENTION

In accordance with an embodiment of the present invention, a shift register circuit having simplified architecture is provided. The shift register circuit comprises a plurality of shift register stages. And an Mth shift register stage of the shift register stages comprises an input unit, a first pull-up unit, a second pull-up unit, a control unit, a pull-down unit, and an auxiliary pull-down unit. The input unit, electrically connected to an (M−1)th shift register stage of the shift register stages for receiving an (N−1)th gate signal, is utilized for inputting the (N−1)th gate signal having high voltage level to become a driving control voltage. The first pull-up unit, electrically connected to the input unit and an Nth gate line of the gate lines, is put in use for pulling up an Nth gate signal of the gate signals according to the driving control voltage and a first clock signal. The Nth gate line is employed to deliver the Nth gate signal. The second pull-up unit, electrically connected to the input unit and an (N+1)th gate line of the gate lines, is put in use for pulling up an (N+1)th gate signal of the gate signals according to the driving control voltage and a second clock signal. The (N+1)th gate line is employed to deliver the (N+1)th gate signal. The control unit, electrically connected to the input unit, functions to generate a pull-down control signal according to the driving control voltage and a control signal. The pull-down unit, electrically connected to the control unit, the input unit, the Nth gate line and the (N+1)th gate line, is utilized for pulling down the driving control voltage, the Nth gate signal and the (N+1)th gate signal according to the pull-down control signal. an auxiliary pull-down unit, electrically connected the input unit, the Nth gate line, the (N+1)th gate line and an (M+1)th shift register stage, is utilized for pulling down the driving control voltage, the Nth gate line and the (N+1)th gate line according to an (N+2)th or (N+3)th gate signal generated by the (M+1)th shift register stage.

The present invention further provides a gate signal generation method used in a shift register circuit for generating plural gate signals furnished to plural gate lines. The shift register circuit comprises a plurality of shift register stages. And an Mth shift register stage of the shift register stages comprises an input unit, a first pull-up unit, a second pull-up unit, a control unit, a pull-down unit, and an auxiliary pull-down unit. The input unit is electrically connected to an (M−1)th shift register stage of the shift register stages. The first pull-up unit is electrically connected to the input unit and an Nth gate line of the gate lines. The second pull-up unit is electrically connected to the input unit and an (N+1)th gate line of the gate lines. The control unit is electrically connected to the input unit. The pull-down unit is electrically connected to the control unit, the input unit, the Nth gate line and the (N+1)th gate line. The auxiliary pull-down unit is electrically connected to an (M+1)th shift register stage of the shift register stages, the input unit, the Nth gate line and the (N+1)th gate line.

The gate signal generation method comprises: the input unit inputting an (N−1)th gate signal generated by the (M−1)th shift register stage to become a driving control voltage during a first interval; the first pull-up unit pulling up an Nth gate signal furnished to the Nth gate line according to the driving control voltage and a first clock signal during a second interval; the second pull-up unit pulling up an (N+1)th gate signal furnished to the (N+1)th gate line according to the driving control voltage and a second clock signal during a third interval; the auxiliary pull-down unit pulling down the driving control voltage according to an (N+2)th or (N+3)th gate signal generated by the (M+1)th shift register stage during a fourth interval, wherein the fourth interval overlaps none of the first, second and third intervals; the control unit generating a pull-down control signal furnished to the pull-down unit according to the driving control voltage and a control signal during the fourth interval; and the pull-down unit pulling down the Nth gate signal and the (N+1)th gate signal according to the pull-down control signal during the fourth interval.

Still, the present invention provides another gate signal generation method used in a shift register circuit for generating plural gate signals furnished to plural gate lines. The shift register circuit comprises a plurality of shift register stages. And an Mth shift register stage of the shift register stages comprises an input unit, a first pull-up unit, a second pull-up unit, a first control unit, a first pull-down unit, a second control unit, a second pull-down unit and an auxiliary pull-down unit. The input unit is electrically connected to an (M−1)th shift register stage of the shift register stages. The first pull-up unit is electrically connected to the input unit and an Nth gate line of the gate lines. The second pull-up unit is electrically connected to the input unit and an (N+1)th gate line of the gate lines. The first control unit is electrically connected to the input unit. The first pull-down unit is electrically connected the first control unit, the input unit, the Nth gate line and the (N+1)th gate line. The second control unit is electrically connected to the input unit. The second pull-down unit is electrically connected the second control unit, the input unit, the Nth gate line and the (N+1)th gate line. The auxiliary pull-down unit is electrically connected to an (M+1)th shift register stage of the shift register stages, the input unit, the Nth gate line and the (N+1)th gate line.

The gate signal generation method comprises: the input unit inputting an (N−1)th gate signal generated by the (M−1)th shift register stage to become a driving control voltage during a first interval of an Ith frame time; the first pull-up unit pulling up an Nth gate signal furnished to the Nth gate line according to the driving control voltage and a first clock signal during a second interval of the Ith frame time; the second pull-up unit pulling up an (N+1)th gate signal furnished to the (N+1)th gate line according to the driving control voltage and a second clock signal during a third interval of the Ith frame time; the auxiliary pull-down unit pulling down the driving control voltage, the Nth gate signal and the (N+1)th gate signal according to an (N+2)th or (N+3)th gate signal generated by the (M+1)th shift register stage during a fourth interval of the Ith frame time, wherein the fourth interval of the Ith frame time overlaps none of the first, second and third intervals of the Ith frame time; the first control unit generating a first pull-down control signal furnished to the first pull-down unit according to the driving control voltage and a first control signal during the fourth interval of the Ith frame time; the first pull-down unit pulling down the driving control voltage, the Nth gate signal and the (N+1)th gate signal according to the first pull-down control signal during the fourth interval of the Ith frame time; the input unit inputting the (N−1)th gate signal generated by the (M−1)th shift register stage to become the driving control voltage during a first interval of an (I+1)th frame time; the first pull-up unit pulling up the Nth gate signal according to the driving control voltage and the first clock signal during a second interval of the (I+1)th frame time; the second pull-up unit pulling up the (N+1)th gate signal furnished to the (N+1)th gate line according to the driving control voltage and the second clock signal during a third interval of the (I+1)th frame time; the auxiliary pull-down unit pulling down the driving control voltage, the Nth gate signal and the (N+1)th gate signal according to the (N+2)th or (N+3)th gate signal generated by the (M+1)th shift register stage during a fourth interval of the (I+1)th frame time, wherein the fourth interval of the (I+1)th frame time overlaps none of the first, second and third intervals of the (I+1)th frame time; the second control unit generating a second pull-down control signal furnished to the second pull-down unit according to the driving control voltage and a second control signal having a phase opposite to the first control signal during the fourth interval of the (I+1)th frame time; and the second pull-down unit pulling down the driving control voltage, the Nth gate signal and the (N+1)th gate signal according to the second pull-down control signal during the fourth interval of the (I+1)th frame time.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto. Furthermore, the step serial numbers regarding the gate signal generation method are not meant thereto limit the operating sequence, and any rearrangement of the operating sequence for achieving same functionality is still within the spirit and scope of the invention.

Figure 1:
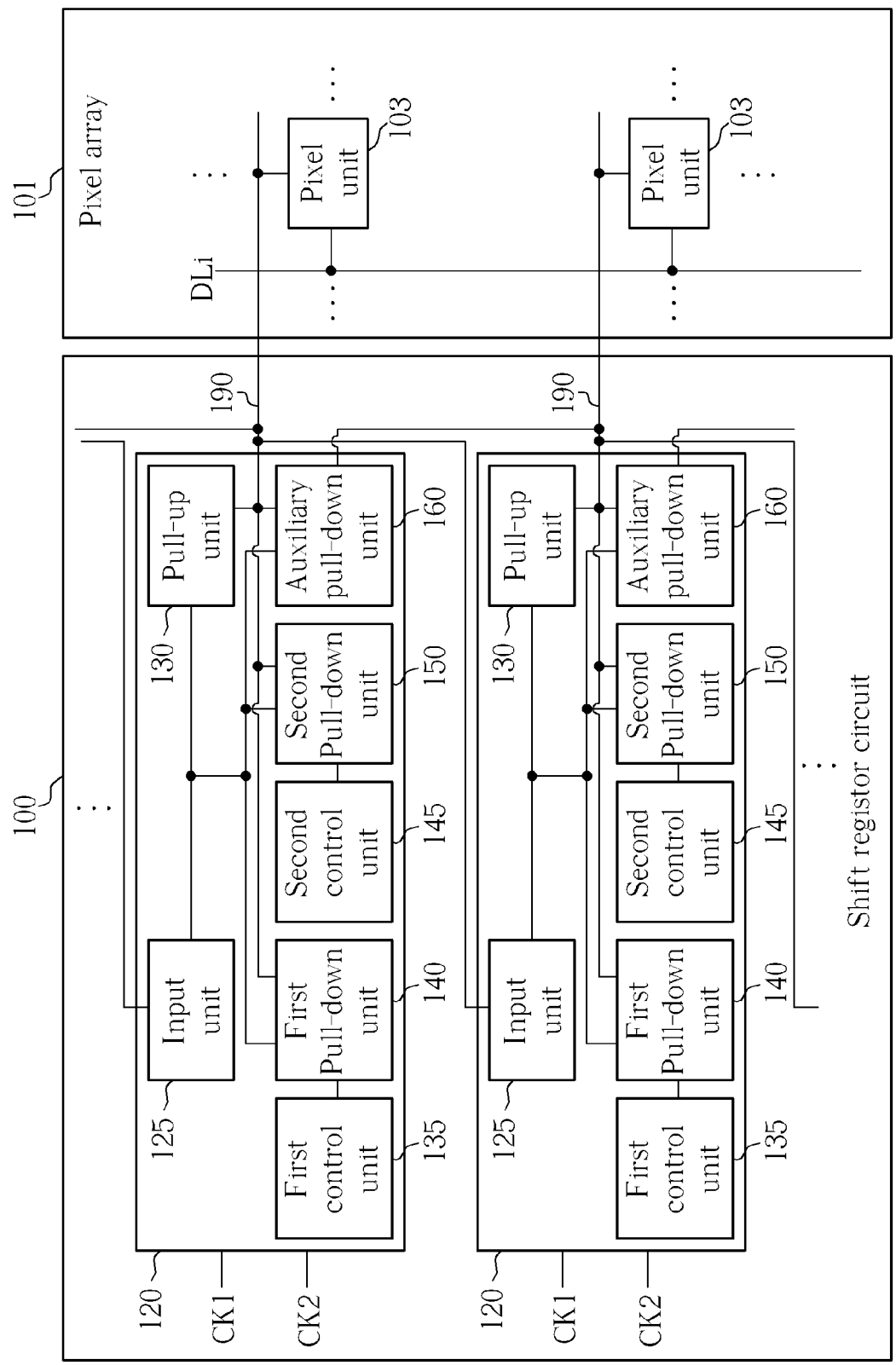
FIG. 1 is a schematic diagram showing a prior-art shift register circuit.
Figure 2:
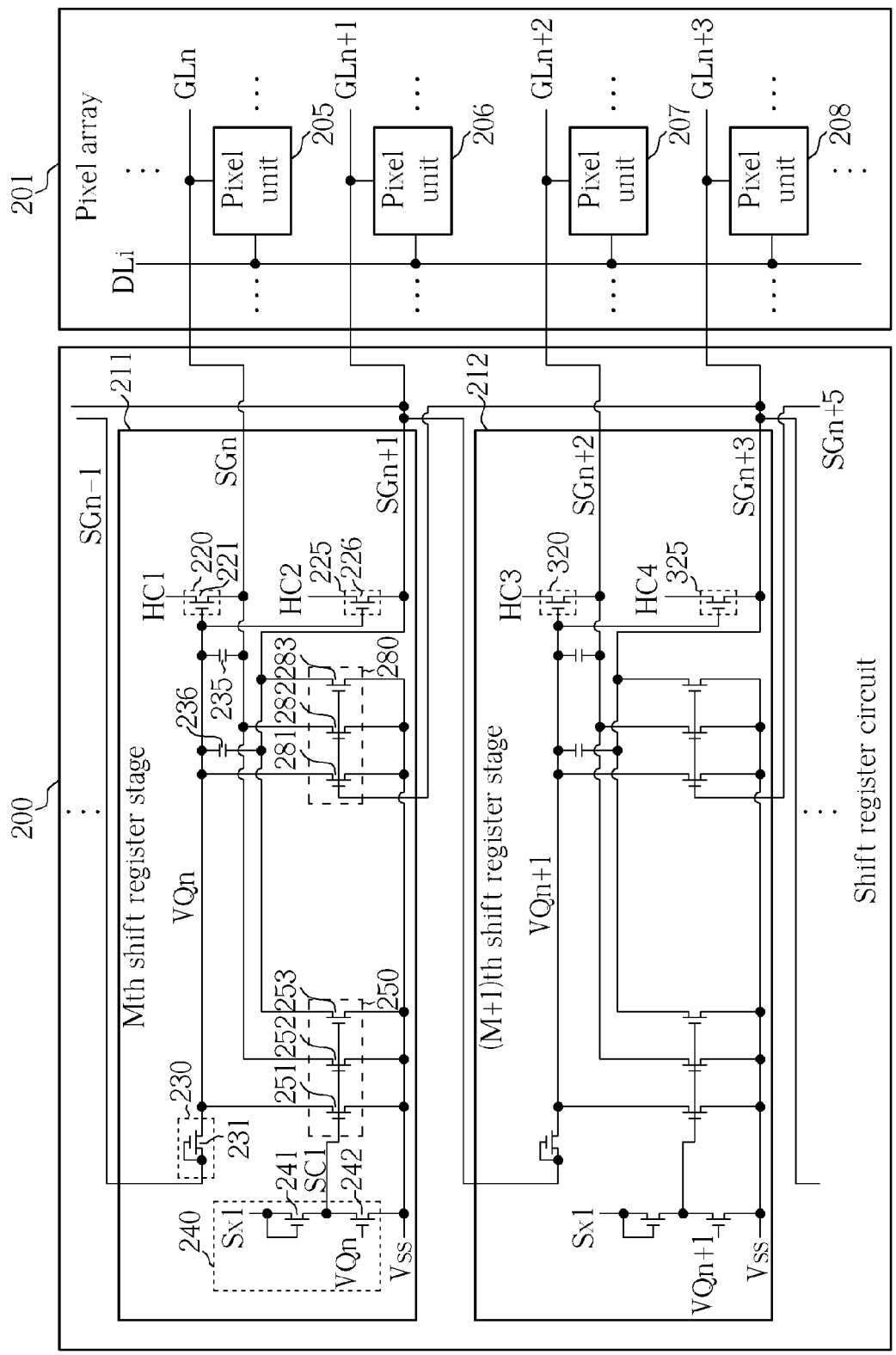
FIG. 2 is a schematic diagram showing a shift register circuit in accordance with a first embodiment of the present invention.

FIG. 2 is a schematic diagram showing a shift register circuit 200 in accordance with a first embodiment of the present invention. As shown in FIG. 2, the shift register circuit 200 comprises a plurality of shift register stages. And for ease of explanation, the shift register circuit 200 illustrates an Mth shift register stage 211 and an (M+1)th shift register stage 212. The Mth shift register stage 211 is employed to provide two gate signals SGn and SGn+1. The (M+1)th shift register stage 212 is employed to provide two gate signals SGn+2 and SGn+3. The numbers M and n are positive integers. Adjacent shift register stages are under control of different clock signals. For instance, the Mth shift register stage 211 is under control of a first clock signal HC1 and a second clock signal HC2 while the (M+1)th shift register stage 212 is under control of a third clock signal HC3 and a fourth clock signal HC4.

The gate signal SGn is furnished to the pixel unit 205 of a pixel array 201 via a gate line GLn for providing a control of writing a corresponding data signal of the data line DLi into the pixel unit 205. The gate signal SGn+1 is furnished to the pixel unit 206 of the pixel array 201 via a gate line GLn+1 for providing a control of writing a corresponding data signal of the data line DLi into the pixel unit 206. The gate signal SGn+1 is further furnished to the (M+1)th shift register stage 212 and functions as a start pulse signal for enabling the (M+1)th shift register stage 212. Besides, the gate signal SGn−1 generated by an (M−1)th shift register stage (not shown) is also used as a start pulse signal to enable the Mth shift register stage 211. The gate signal SGn+2 is furnished to the pixel unit 207 of the pixel array 201 via a gate line GLn+2 for providing a control of writing a corresponding data signal of the data line DLi into the pixel unit 207. The gate signal SGn+3 is furnished to the pixel unit 208 of the pixel array 201 via a gate line GLn+3 for providing a control of writing a corresponding data signal of the data line DLi into the pixel unit 208. The gate signal SGn+3 is further furnished to an (M+2)th shift register stage (not shown) and functions as a start pulse signal for enabling the (M+2)th shift register stage.

The Mth shift register stage 211 comprises an input unit 230, a first capacitor 235, a second capacitor 236, a first pull-up unit 220, a second pull-up unit 225, a first control unit 240, a first pull-down unit 250 and an auxiliary pull-down unit 280. The input unit 230, electrically connected to the (M−1)th shift register stage for receiving the gate signal SGn−1, is employed to input the gate signal SGn−1 having high voltage level to become a driving control voltage VQn. The first capacitor 235 and the second capacitor 236 are put in use for storing the driving control voltage VQn. The first pull-up unit 220, electrically connected to the gate line GLn, is used to pull up the gate signal SGn of the gate line GLn according to the driving control voltage VQn and the first clock signal HC1. The second pull-up unit 225, electrically connected to the gate line GLn+1, is used to pull up the gate signal SGn+1 of the gate line GLn+1 according to the driving control voltage VQn and the second clock signal HC2. The first control unit 240, electrically connected to the input unit 230 and the first pull-down unit 250, is employed to generate a first pull-down control signal SC1 according to the driving control voltage VQn and a first control signal Sx1. The first pull-down unit 250, electrically connected to the first control unit 240, the input unit 230, the gate line GLn and the gate line GLn+1, is used to pull down the driving control voltage VQn, the gate signal SGn and the gate signal SGn+1 according to the first pull-down control signal SC1. The auxiliary pull-down unit 280, electrically connected to the (M+1)th shift register stage 212, the input unit 230, the gate line GLn and the gate line GLn+1, is used to pull down the driving control voltage VQn, the gate signal SGn and the gate signal SGn+1 according to the gate signal SGn+3. It is noted that the first pull-up unit 320 of the (M+1)th shift register stage 212 is used to pull up the gate signal SGn+2 of the gate line GLn+2 according to a driving control voltage VQn+1 and the first clock signal HC3, and the second pull-up unit 325 of the (M+1)th shift register stage 212 is used to pull up the gate signal SGn+3 of the gate line GLn+3 according to the driving control voltage VQn+1 and the fourth clock signal HC4.

In the embodiment shown in FIG. 2, the first pull-up unit 220 comprises a first transistor 221, the second pull-up unit 225 comprises a second transistor 226, the input unit 230 comprises a third transistor 231, the first control unit 240 comprises a fourth transistor 241 and a fifth transistor 242, the first pull-down unit 250 comprises a sixth transistor 251, a seventh transistor 252 and an eighth transistor 253, and the auxiliary pull-down unit 280 comprises a ninth transistor 281, a tenth transistor 282 and an eleventh transistor 283. The first transistor 221 through the eleventh transistor 283 are thin film transistors, metal oxide semiconductor (MOS) field effect transistors or junction field effect transistors.

The third transistor 231 comprises a first end for receiving the gate signal SGn−1, a gate end electrically connected to the first end, and a second end electrically connected to the first pull-up unit 220 and the second pull-up unit 225. The circuit functionality of the third transistor 231 is actually similar to a diode. Accordingly, the first and second ends of the third transistor 231 are corresponding respectively to the anode and cathode of a diode. In view of that, the third transistor 231 is turned on by the gate signal SGn−1 having high voltage level for passing the gate signal SGn−1 to become the driving control voltage VQn; alternatively, the third transistor 231 is turned off by the gate signal SGn−1 having low voltage level.

The first transistor 221 comprises a first end for receiving the first clock signal HC1, a gate end electrically connected to the second end of the third transistor 231, and a second end electrically connected to the gate line GLn. The first capacitor 235 is electrically connected between the gate and second ends of the first transistor 221. The second transistor 226 comprises a first end for receiving the second clock signal HC2, a gate end electrically connected to the second end of the third transistor 231, and a second end electrically connected to the gate line GLn+1. The second capacitor 236 is connected between the gate and second ends of the second transistor 226.

The fourth transistor 241 comprises a first end for receiving the first control signal Sx1, a gate end electrically connected to the first end, and a second end electrically connected to the first pull-down unit 250. The fifth transistor 242 comprises a first end electrically connected to the second end of the fourth transistor 241, a gate end electrically connected to the second end of the third transistor 231 for receiving the driving control voltage VQn, and a second end for receiving a low power voltage Vss. The sixth transistor 251 comprises a first end electrically connected to the second end of the third transistor 231, a gate end electrically connected to the second end of the fourth transistor 241 for receiving the first pull-down control signal SC1, and a second end for receiving the low power voltage Vss. The seventh transistor 252 comprises a first end electrically connected to the gate line GLn, a gate end electrically connected to the gate end of the sixth transistor 251, and a second end for receiving the low power voltage Vss. The eighth transistor 253 comprises a first end electrically connected to the gate end of the sixth transistor 251, and s second end electrically connected to the low power voltage Vss.

The ninth transistor 281 comprises a first end electrically connected to the second end of the third transistor 231, a gate end electrically connected to the (M+1)th shift register stage 212 for receiving the gate signal SGn+3, and a second end for receiving the low power voltage Vss. The tenth transistor 282 comprises a first end electrically connected to the gate line GLn, a gate end electrically connected to the gate end of the ninth transistor 281, and a second end for receiving the low power voltage Vss. The eleventh transistor 283 comprises a first end electrically connected to the gate line GLn+1, a gate end electrically connected to the gate end of the ninth transistor 281, and a second end for receiving the low power voltage Vss.

In view of the above description, regarding the circuit structure of the Mth shift register stage 211 for generating the gate signal SGn and the gate signal SGn+1, the input unit 230, the first control unit 240, the first pull down unit 250 and the auxiliary pull-down unit 280 are shared to perform related pull-down operations on the gate signal SGn and the gate signal SGn+1. That is, compared with the prior-art shift register circuit, the circuit structure of the shift register circuit 200 is significantly simplified to bring the cost down.

Figure 3:
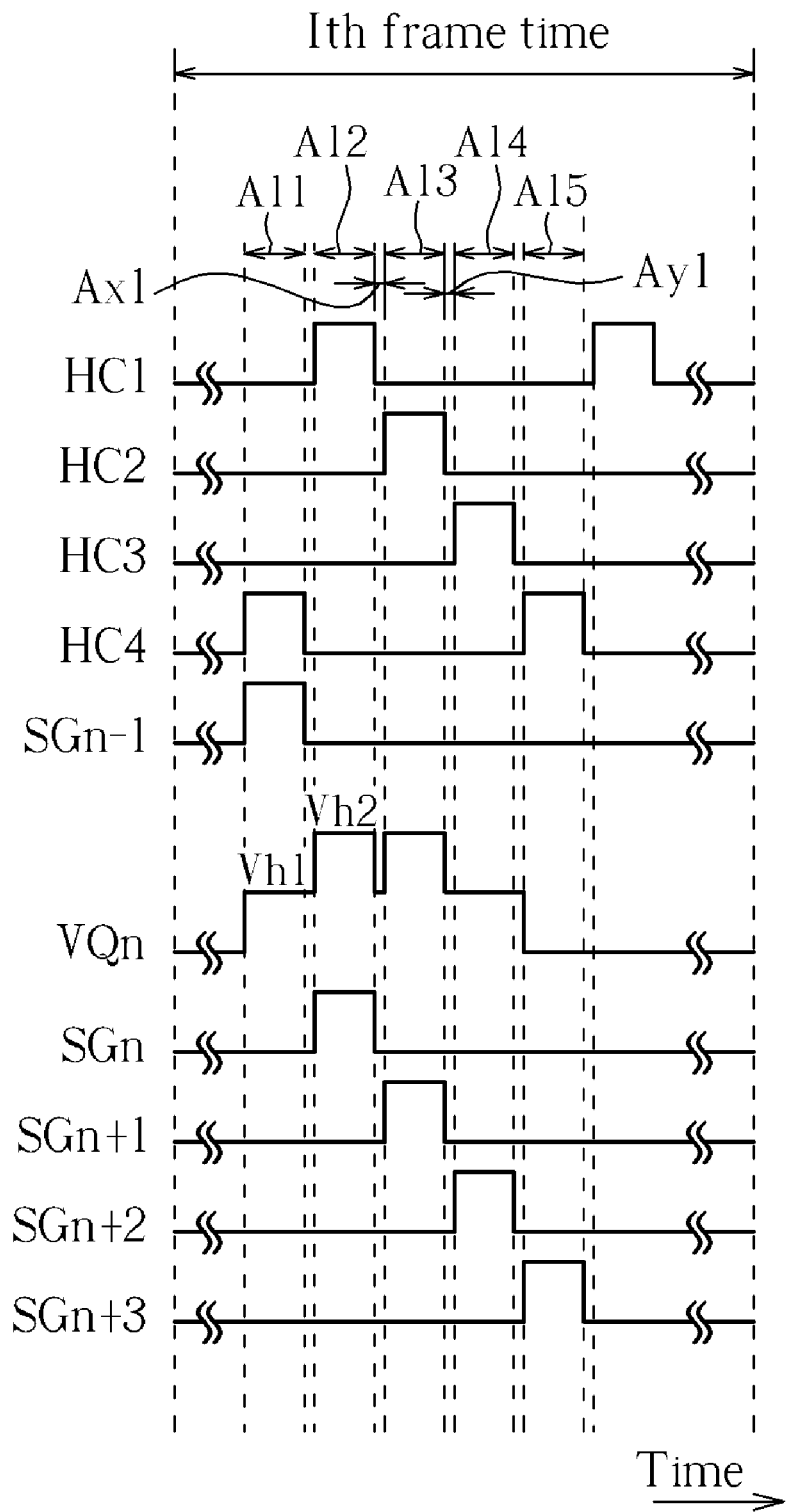
FIG. 3 is a schematic diagram showing related signal waveforms regarding a first circuit operation case of the shift register circuit shown in FIG. 2, having time along the abscissa.

FIG. 3 is a schematic diagram showing related signal waveforms regarding a first circuit operation case of the shift register circuit 200 shown in FIG. 2, having time along the abscissa. The signal waveforms in FIG. 3, from top to bottom, are the first clock signal HC1, the second clock signal HC2, the third clock signal HC3, the fourth clock signal HC4, the gate signal SGn−1, the driving control voltage VQn, the gate signal SGn, the gate signal SGn+1, the gate signal SGn+2 and the gate signal SGn+3. As shown in FIG. 3, the periodical pulses of the first clock signal HC1 through the fourth clock signal HC4 are non-overlapped to each other. In the first circuit operation case of the shift register circuit 200, the first control signal Sx1 can be the first clock signal HC1, the second clock signal HC2, the third clock signal HC3, the fourth clock signal HC4, a dc voltage capable of turning on the fourth transistor 241, or another clock signal different from the clock signals HC1~HC4. The first circuit operation case of the shift register circuit 200 is detailed as the followings.

During the interval A11 of an Ith frame time, the gate signal SGn−1 is shifting from low voltage level to high voltage level, the third transistor 231 is then turned on for boosting the driving control voltage VQn from a bottom voltage to a first high voltage Vh1. Meanwhile, the driving control voltage VQn is able to turn on the fifth transistor 242 for pulling down the first pull-down control signal SC1 to the low power voltage Vss. Accordingly, the sixth transistor 251, the seventh transistor 252 and the eighth transistor 253 are turned off. During the interval A12 of the Ith frame time, the gate signal SGn−1 holds low voltage level, the third transistor 231 is then turned off and the driving control voltage VQn becomes a floating voltage. In the meantime, along with the switching of the first clock signal HC1 from low voltage level to high voltage level, the driving control voltage VQn is further boosted from the first high voltage Vh1 to a second high voltage Vh2 due to a capacitive coupling effect caused by the device capacitor of the first transistor 221. Accordingly, the first transistor 221 is turned on for pulling up the gate signal SGn form low voltage level to high voltage level.

During the interval Ax1 of the Ith frame time, the first clock signal HC1 is shifting down from high voltage level to low voltage level, and the gate signal SGn is therefore shifting down to low voltage level. Then, the driving control voltage VQn is pulled down from the second high voltage Vh2 to the first high voltage Vh1 due to the capacitive coupling effect caused by the device capacitor of the first transistor 221. During the interval A13 of the Ith frame time, along with the switching of the second clock signal HC2 from low voltage level to high voltage level, the driving control voltage VQn is boosted again from the first high voltage Vh1 to the second high voltage Vh2 due to the capacitive coupling effect caused by the device capacitor of the second transistor 226. Accordingly, the second transistor 226 is turned on for pulling up the gate signal SGn+1 form low voltage level to high voltage level. During the interval Ay1 of the Ith frame time, the second clock signal HC2 is shifting down from high voltage level to low voltage level, and the gate signal SGn+1 is therefore shifting down to low voltage level. Then, the driving control voltage VQn is pulled down again from the second high voltage Vh2 to the first high voltage Vh1 due to the capacitive coupling effect caused by the device capacitor of the second transistor 226.

Besides, by making use of the gate signal SGn+1 as a start pulse signal during the interval A13 of the Ith frame time, the (M+1)th shift register stage 212 is enabled to generate the gate signal SGn+2 having high voltage level during the interval A14 of the Ith frame time and also to generate the gate signal SGn+3 having high voltage level during the interval A15 of the Ith frame time. Based on the gate signal SGn+3 having high voltage level, the ninth transistor 281, the tenth transistor 282 and the eleventh transistor 283 are turned on for respectively pulling down the driving control voltage VQn, the gate signal SGn and the gate signal SGn+1 to the low power voltage Vss during the interval A15 of the Ith frame time. Following a decrease of the driving control voltage vQn, the fifth transistor 242 is then turned off and the first control signal Sx1 having high voltage level can be employed to pull up the first pull-down control signal SC1 via the fourth transistor 241. In turn, the sixth transistor 251, the seventh transistor 252 and the eighth transistor 253 are turned on for respectively pulling down the driving control voltage VQn, the gate signal SGn and the gate signal SGn+1 to the low power voltage Vss. Thereafter, during the other time of the Ith frame time, with the purpose of retaining the low voltage levels of the gate signal SGn and the gate signal SGn+1, the first pull-down control signal SC1 is employed to continuously or periodically pull down the driving control voltage VQn, the gate signal SGn and the gate signal SGn+1.

Figure 4:
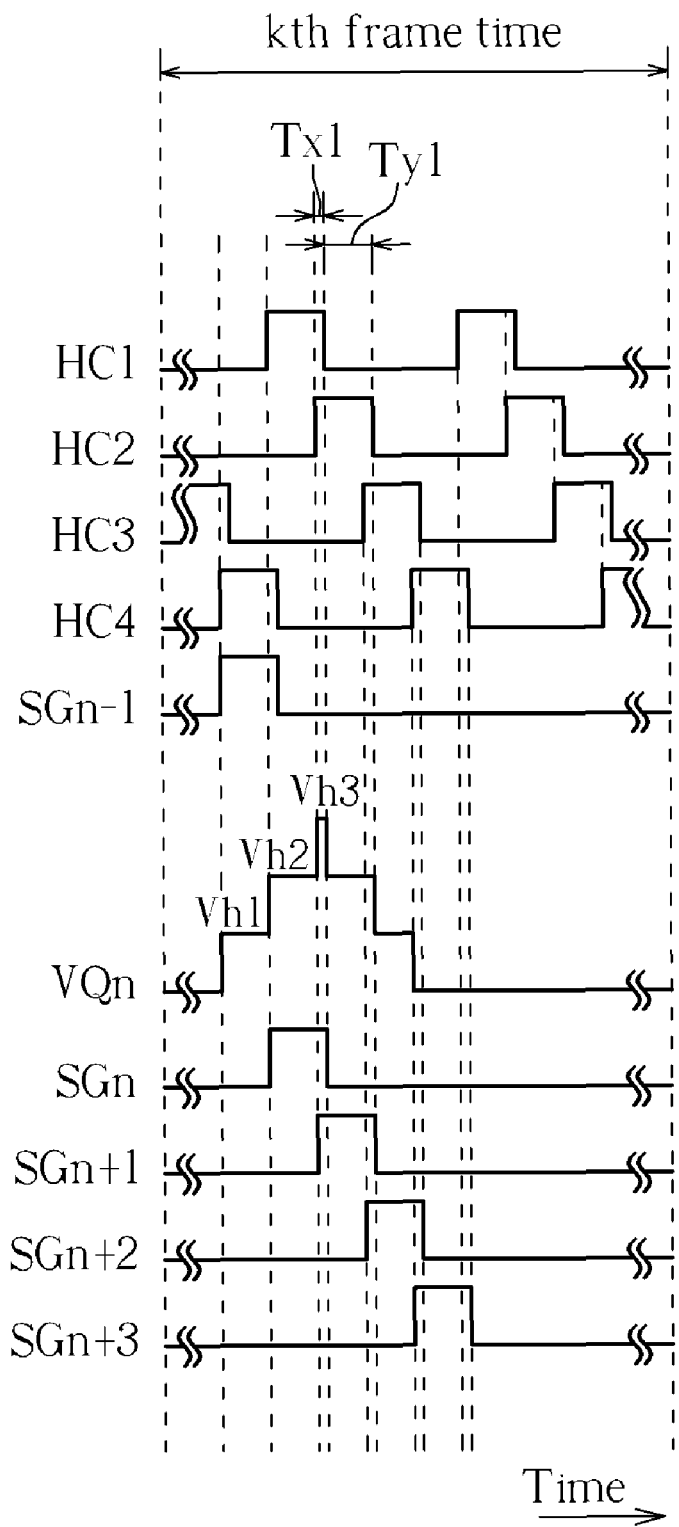
FIG. 4 is a schematic diagram showing related signal waveforms regarding a second circuit operation case of the shift register circuit shown in FIG. 2, having time along the abscissa.

FIG. 4 is a schematic diagram showing related signal waveforms regarding a second circuit operation case of the shift register circuit 200 shown in FIG. 2, having time along the abscissa. The signal waveforms in FIG. 4, from top to bottom, are the first clock signal HC1, the second clock signal HC2, the third clock signal HC3, the fourth clock signal HC4, the gate signal SGn−1, the driving control voltage VQn, the gate signal SGn, the gate signal SGn+1, the gate signal SGn+2 and the gate signal SGn+3. As shown in FIG. 4, the periodical pulses of the first clock signal HC1 through the fourth clock signal HC4 are partly overlapped. Similarly, in the second circuit operation case of the shift register circuit 200, the first control signal Sx1 can be the first clock signal HC1, the second clock signal HC2, the third clock signal HC3, the fourth clock signal HC4, the aforementioned dc voltage, or another clock signal different from the clock signals HC1~HC4. The second circuit operation case of the shift register circuit 200 is essentially similar to the first circuit operation case of the shift register circuit 200 shown in FIG. 3, having a major difference occurring to the interval Tx1 of a Kth frame time. Since the interval Tx1 is an overlap interval of the pulses of the first clock signal HC1 and the second clock signal HC2, the driving control voltage VQn is further boosted from the second high voltage Vh2 to a third high voltage Vh3 due to the capacitive coupling effect caused by the device capacitor of the second transistor 226 during the interval Tx1. Thereafter, during the interval Ty1 of the Kth frame time, along with the switching of the first clock signal HC1 from high voltage level to low voltage level, the driving control voltage VQn is then pulled down from the third high voltage Vh3 to the second high voltage Vh2 due to the capacitive coupling effect caused by the device capacitor of the first transistor 221. Except for the abovementioned major difference, the pull-up or pull-down operations regarding the driving control voltage VQn and the gate signals SGn~SGn+3 during the other intervals can be inferred by analogy according to the above description for the first circuit operation case of the shift register circuit 200.

Figure 5:
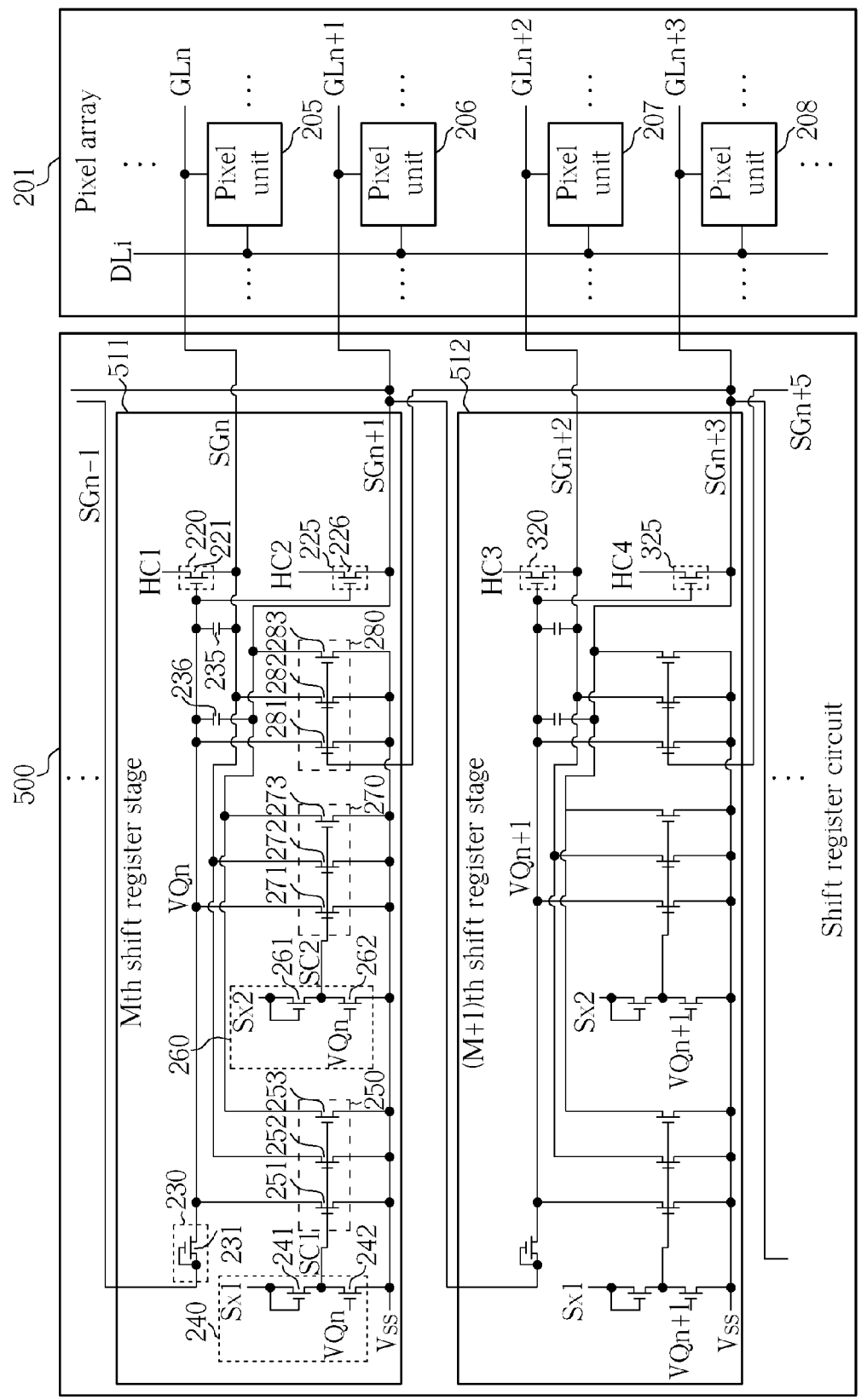
FIG. 5 is a schematic diagram showing a shift register circuit in accordance with a second embodiment of the present invention.

FIG. 5 is a schematic diagram showing a shift register circuit 500 in accordance with a second embodiment of the present invention. As shown in FIG. 5, the shift register circuit 500 comprises a plurality of shift register stages. And for ease of explanation, the shift register circuit 500 illustrates an Mth shift register stage 511 and an (M+1)th shift register stage 512. The circuit structure of the Mth shift register stage 511 is similar to that of the Mth shift register stage 211 shown in FIG. 2. Compared with the Mth shift register stage 211, the Mth shift register stage 511 further comprises a second control unit 260 and a second pull-down unit 270. The second control unit 260, electrically connected to the input unit 230 and the second pull-down unit 270, is utilized for generating a second pull-down control signal SC2 according to the driving control voltage VQn and a second control signal Sx2. The second pull-down unit 270, electrically connected to the second control unit 260, the input unit 230, the gate line GLn and the gate line GLn+1, is put in use for pulling down the driving control voltage VQn, the gate signal SGn and the gate signal SGn+1 according to the second pull-down control signal SC2.

In the embodiment shown in FIG. 5, the second control unit 260 comprises a twelfth transistor 261 and a thirteenth transistor 262, and the second pull-down unit 270 comprises a fourteenth transistor 271, a fifteenth transistor 272 and a sixteenth transistor 273. The twelfth transistor 261 through the sixteenth transistor 273 are thin film transistors, MOS field effect transistors or junction field effect transistors. The twelfth transistor 261 comprises a first end for receiving the second control signal Sx2, a gate end electrically connected to the first end, and a second end electrically connected to the second pull-down unit 270. The thirteenth transistor 262 comprises a first end electrically connected to the second end of the twelfth transistor 261, a gate end electrically connected to the second end of the third transistor 231 for receiving the driving control voltage VQn, and a second end for receiving the low power voltage Vss. The fourteenth transistor 271 comprises a first end electrically connected to the second end of the third transistor 231, a gate end electrically connected to the second end of the twelfth transistor 261 for receiving the second pull-down control signal SC2, and a second end for receiving the low power voltage Vss. The fifteenth transistor 272 comprises a first end electrically connected to the gate line GLn, a gate end electrically connected to the gate end of the fourteenth transistor 271, and a second end for receiving the low power voltage Vss. The sixteenth transistor 273 comprises a first end electrically connected to the gate line GLn+1, a gate end electrically connected to the gate end of the fourteenth transistor 271, and a second end for receiving the low power voltage Vss.

In view of the above description, regarding the circuit structure of the Mth shift register stage 511 for generating the gate signal SGn and the gate signal SGn+1, the input unit 230, the first control unit 240, the first pull down unit 250, the second control unit 260, the second pull-down unit 270 and the auxiliary pull-down unit 280 are shared to perform related pull-down operations on the gate signal SGn and the gate signal SGn+1. That is, compared with the prior-art shift register circuit, the circuit structure of the shift register circuit 500 is significantly simplified to bring the cost down. Besides, the first control unit 240, the first pull-down unit 250, the second control unit 260 and the second pull-down unit 270 are put in use together for providing an alternating pull-down mechanism so as to significantly enhance the life-time of circuit components in the shift register circuit 500.

Figure 6:
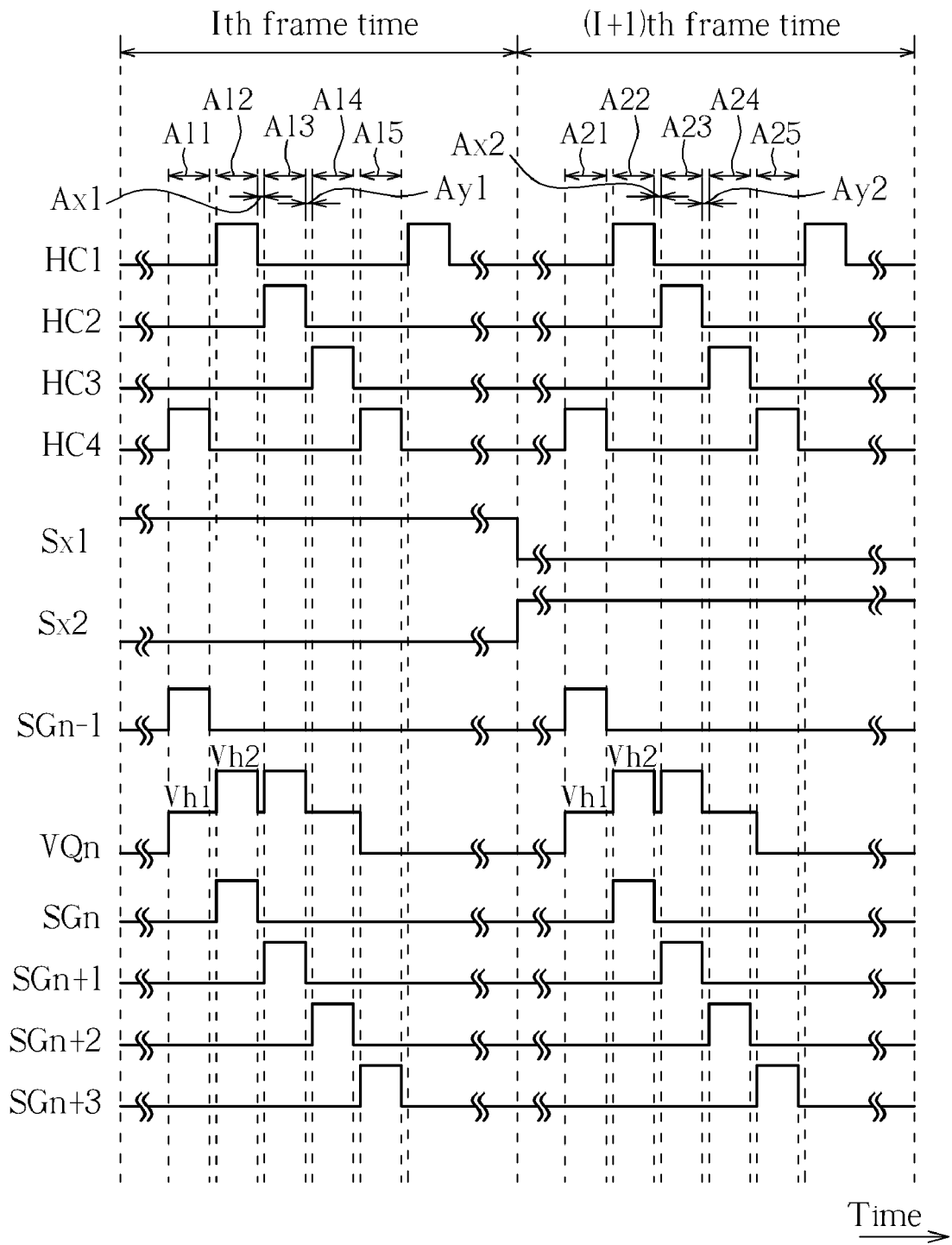
FIG. 6 is a schematic diagram showing related signal waveforms regarding a first circuit operation case of the shift register circuit shown in FIG. 5, having time along the abscissa.

FIG. 6 is a schematic diagram showing related signal waveforms regarding a first circuit operation case of the shift register circuit 500 shown in FIG. 5, having time along the abscissa. The signal waveforms in FIG. 6, from top to bottom, are the first clock signal HC1, the second clock signal HC2, the third clock signal HC3, the fourth clock signal HC4, the first control signal Sx1, the second control signal Sx2, the gate signal SGn−1, the driving control voltage VQn, the gate signal SGn, the gate signal SGn+1, the gate signal SGn+2 and the gate signal SGn+3. As shown in FIG. 6, the periodical pulses of the first clock signal HC1 through the fourth clock signal HC4 are non-overlapped to each other. Besides, the first control signal Sx1 and the second control signal Sx2 differ in phase by 180 degrees and each period thereof include two frame times. For instance, the first control signal Sx1 and the second control signal Sx2 retain high and low voltage levels respectively during the Ith frame time and, alternatively, the first control signal Sx1 and the second control signal Sx2 retain low and high voltage levels respectively during the (I+1)th frame time. The first circuit operation case of the shift register circuit 500 is detailed as the followings.

During the interval A11 of an Ith frame time, the gate signal SGn−1 is shifting from low voltage level to high voltage level, the third transistor 231 is then turned on for boosting the driving control voltage VQn from a bottom voltage to a first high voltage Vh1. Meanwhile, the driving control voltage VQn is able to turn on the fifth transistor 242 and the thirteenth transistor 262 for pulling down the first pull-down control signal SC1 and the second pull-down control signal SC2 to the low power voltage Vss. Accordingly, the transistors 251~253 and the transistors 271~273 are turned off. During the interval A12 of the Ith frame time, the gate signal SGn−1 holds low voltage level, the third transistor 231 is then turned off and the driving control voltage VQn becomes a floating voltage. In the meantime, along with the switching of the first clock signal HC1 from low voltage level to high voltage level, the driving control voltage VQn is further boosted from the first high voltage Vh1 to a second high voltage Vh2 due to a capacitive coupling effect caused by the device capacitor of the first transistor 221. Accordingly, the first transistor 221 is turned on for pulling up the gate signal SGn form low voltage level to high voltage level.

During the interval Ax1 of the Ith frame time, the first clock signal HC1 is shifting down from high voltage level to low voltage level, and the gate signal SGn is therefore shifting down to low voltage level. Then, the driving control voltage VQn is pulled down from the second high voltage Vh2 to the first high voltage Vh1 due to the capacitive coupling effect caused by the device capacitor of the first transistor 221. During the interval A13 of the Ith frame time, along with the switching of the second clock signal HC2 from low voltage level to high voltage level, the driving control voltage VQn is boosted again from the first high voltage Vh1 to the second high voltage Vh2 due to the capacitive coupling effect caused by the device capacitor of the second transistor 226. Accordingly, the second transistor 226 is turned on for pulling up the gate signal SGn+1 form low voltage level to high voltage level. During the interval Ay1 of the Ith frame time, the second clock signal HC2 is shifting down from high voltage level to low voltage level, and the gate signal SGn+1 is therefore shifting down to low voltage level. Then, the driving control voltage VQn is pulled down again from the second high voltage Vh2 to the first high voltage Vh1 due to the capacitive coupling effect caused by the device capacitor of the second transistor 226.

Besides, by making use of the gate signal SGn+1 as a start pulse signal during the interval A13 of the Ith frame time, the (M+1)th shift register stage 512 is enabled to generate the gate signal SGn+2 having high voltage level during the interval A14 of the Ith frame time and also to generate the gate signal SGn+3 having high voltage level during the interval A15 of the Ith frame time. Based on the gate signal SGn+3 having high voltage level, the ninth transistor 281, the tenth transistor 282 and the eleventh transistor 283 are turned on for respectively pulling down the driving control voltage VQn, the gate signal SGn and the gate signal SGn+1 to the low power voltage Vss during the interval A15 of the Ith frame time. Following a decrease of the driving control voltage vQn, the fifth transistor 242 and the thirteenth transistor 262 are then turned off and the first control signal Sx1 having high voltage level can be employed to pull up the first pull-down control signal SC1 via the fourth transistor 241. In turn, the sixth transistor 251, the seventh transistor 252 and the eighth transistor 253 are turned on for respectively pulling down the driving control voltage VQn, the gate signal SGn and the gate signal SGn+1 to the low power voltage Vss. Thereafter, during the other time of the Ith frame time, with the purpose of retaining the low voltage levels of the gate signal SGn and the gate signal SGn+1, the first pull-down control signal SC1 having high voltage level is employed to continuously pull down the driving control voltage VQn, the gate signal SGn and the gate signal SGn+1.

The circuit operations regarding the intervals A21, A22, Ax2, A23, Ay2 and A24 of the (I+1)th frame time are similar to the aforementioned circuit operations regarding the intervals A11, A12, Ax1, A13, Ay1 and A14 of the Ith frame time, and for the sake of brevity, further similar discussion thereof is omitted. During the interval A25 of the (I+1)th frame time, since the thirteenth transistor 262 is turned off, the second control signal Sx2 having high voltage level can be employed to pull up the second pull-down control signal SC2 via the twelfth transistor 261. In turn, the fourteenth transistor 271, the fifteenth transistor 272 and the sixteenth transistor 273 are turned on for respectively pulling down the driving control voltage VQn, the gate signal SGn and the gate signal SGn+1 to the low power voltage Vss. Thereafter, during the other time of the (I+1)th frame time, with the purpose of retaining the low voltage levels of the gate signal SGn and the gate signal SGn+1, the second pull-down control signal SC2 having high voltage level is employed to continuously pull down the driving control voltage VQn, the gate signal SGn and the gate signal SGn+1.

Figure 7:
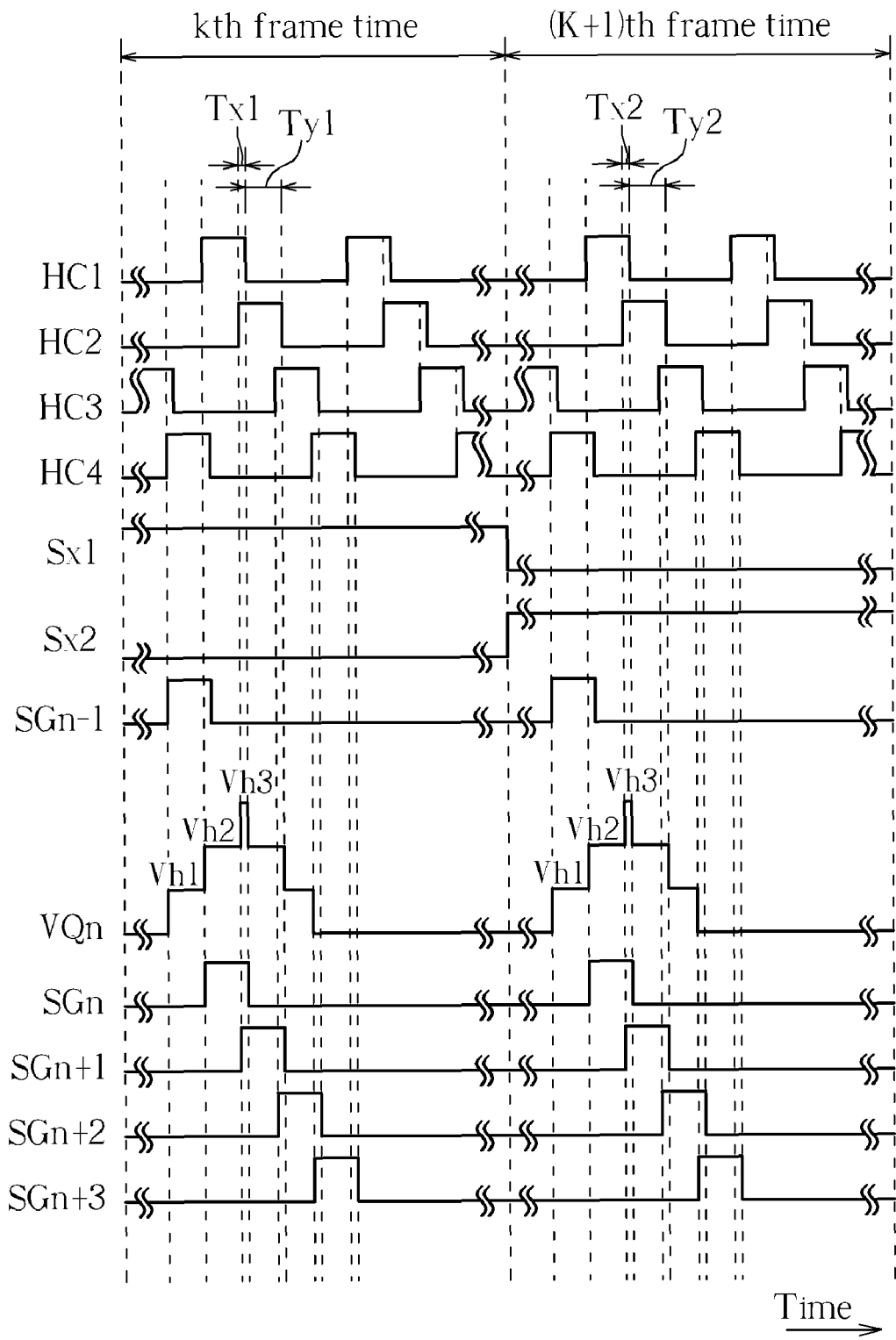
FIG. 7 is a schematic diagram showing related signal waveforms regarding a second circuit operation case of the shift register circuit shown in FIG. 5, having time along the abscissa.

FIG. 7 is a schematic diagram showing related signal waveforms regarding a second circuit operation case of the shift register circuit 500 shown in FIG. 5, having time along the abscissa. The signal waveforms in FIG. 7, from top to bottom, are the first clock signal HC1, the second clock signal HC2, the third clock signal HC3, the fourth clock signal HC4, the first control signal Sx1, the second control signal Sx2, the gate signal SGn−1, the driving control voltage VQn, the gate signal SGn, the gate signal SGn+1, the gate signal SGn+2 and the gate signal SGn+3. As shown in FIG. 7, the periodical pulses of the first clock signal HC1 through the fourth clock signal HC4 are partly overlapped. Similarly, the first control signal Sx1 and the second control signal Sx2 differ in phase by 180 degrees and each period thereof include two frame times.

The second circuit operation case of the shift register circuit 500 is essentially similar to the first circuit operation case shown in FIG. 6, having major differences occurring to the intervals Tx1, Tx2 in the Kth and (K+1)th frame times respectively. Since the intervals Tx1 and Tx2 are overlap intervals of the pulses of the first clock signal HC1 and the second clock signal HC2, the driving control voltage VQn is further boosted from the second high voltage Vh2 to a third high voltage Vh3 due to the capacitive coupling effect caused by the device capacitor of the second transistor 226 during the intervals Tx1 and Tx2. Thereafter, during the intervals Ty1, Ty2 in the Kth and (K+1)th frame times respectively, along with the switching of the first clock signal HC1 from high voltage level to low voltage level, the driving control voltage VQn is then pulled down from the third high voltage Vh3 to the second high voltage Vh2 due to the capacitive coupling effect caused by the device capacitor of the first transistor 221. Except for the abovementioned major differences, the pull-up or pull-down operations regarding the driving control voltage VQn and the gate signals SGn~SGn+3 during the other intervals in the Kth and (K+1)th frame times can be inferred by analogy according to the above description for the first circuit operation case of the shift register circuit 500.

Figure 8:
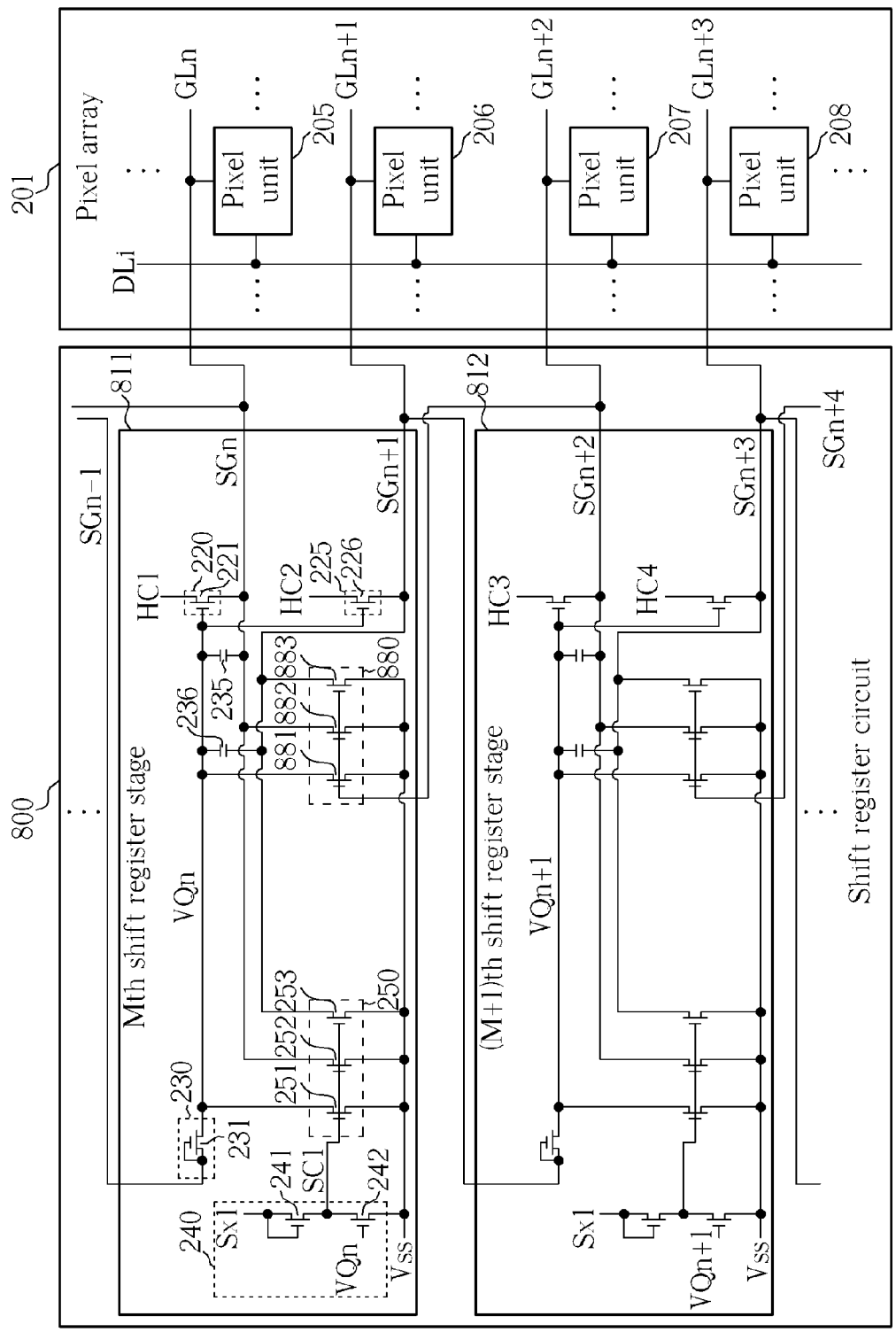
FIG. 8 is a schematic diagram showing a shift register circuit in accordance with a third embodiment of the present invention.

FIG. 8 is a schematic diagram showing a shift register circuit 500 in accordance with a third embodiment of the present invention. As shown in FIG. 8, the shift register circuit 800 comprises a plurality of shift register stages. And for ease of explanation, the shift register circuit 800 illustrates an Mth shift register stage 811 and an (M+1)th shift register stage 812. The circuit structure of the Mth shift register stage 811 is similar to that of the Mth shift register stage 211 shown in FIG. 2, differing in that the auxiliary pull-down unit 280 is replaced with an auxiliary pull-down unit 880. The auxiliary pull-down unit 880, electrically connected to the (M+1)th shift register stage 812, the input unit 230, the gate line GLn and the gate line GLn+1, is used to pull down the driving control voltage VQn, the gate signal SGn and the gate signal SGn+1 according to the gate signal SGn+2. The auxiliary pull-down unit 880 comprises a ninth transistor 881, a tenth transistor 882 and an eleventh transistor 883, which are thin film transistors, MOS field effect transistors or junction field effect transistors.

The ninth transistor 881 comprises a first end electrically connected to the second end of the third transistor 231, a gate end electrically connected to the (M+1)th shift register stage 812 for receiving the gate signal SGn+2, and a second end for receiving the low power voltage Vss. The tenth transistor 882 comprises a first end electrically connected to the gate line GLn, a gate end electrically connected to the gate end of the ninth transistor 881, and a second end for receiving the low power voltage Vss. The eleventh transistor 883 comprises a first end electrically connected to the gate line GLn+1, a gate end electrically connected to the gate end of the ninth transistor 881, and a second end for receiving the low power voltage Vss.

Regarding the circuit structure of the Mth shift register stage 811 for generating the gate signal SGn and the gate signal SGn+1, the input unit 230, the first control unit 240, the first pull down unit 250 and the auxiliary pull-down unit 880 are shared to perform related pull-down operations on the gate signal SGn and the gate signal SGn+1. That is, compared with the prior-art shift register circuit, the circuit structure of the shift register circuit 800 is also significantly simplified to bring the cost down.

Figure 9:
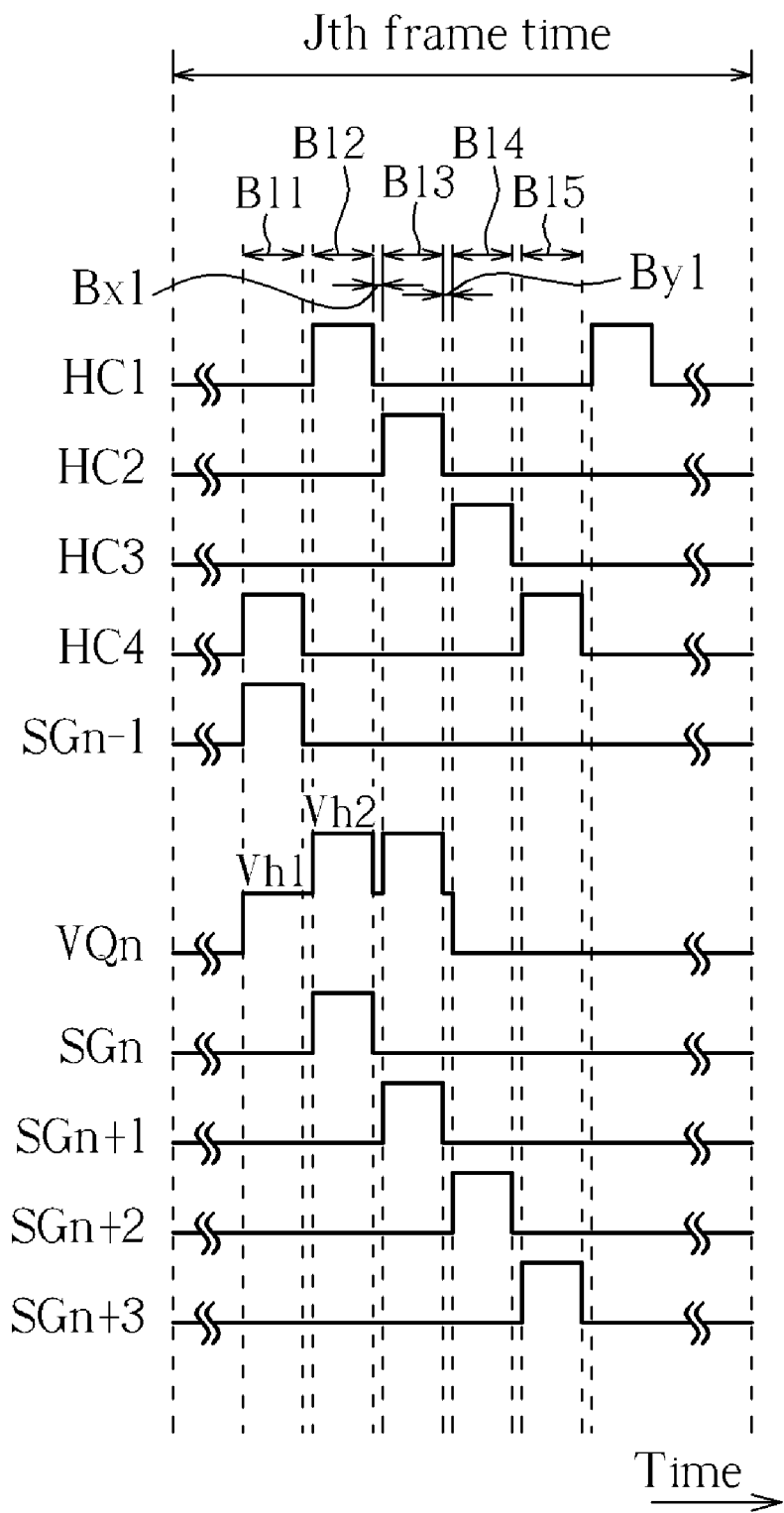
FIG. 9 is a schematic diagram showing related signal waveforms regarding a preferred circuit operation case of the shift register circuit shown in FIG. 8, having time along the abscissa.

FIG. 9 is a schematic diagram showing related signal waveforms regarding a preferred circuit operation case of the shift register circuit 800 shown in FIG. 8, having time along the abscissa. The signal waveforms in FIG. 8, from top to bottom, are the first clock signal HC1, the second clock signal HC2, the third clock signal HC3, the fourth clock signal HC4, the gate signal SGn−1, the driving control voltage VQn, the gate signal SGn, the gate signal SGn+1, the gate signal SGn+2 and the gate signal SGn+3. As shown in FIG. 9, the periodical pulses of the first clock signal HC1 through the fourth clock signal HC4 are non-overlapped to each other. In the preferred circuit operation case of the shift register circuit 800, the first control signal Sx1 can be the first clock signal HC1, the second clock signal HC2, the third clock signal HC3, the fourth clock signal HC4, the aforementioned dc voltage, or another clock signal different from the clock signals HC1~HC4. The preferred circuit operation case of the shift register circuit 800 is briefed as the followings.

The circuit operations of the shift register circuit 800 regarding the intervals B11, B12, Bx1, B13 and By1 of a Jth frame time are similar to the aforementioned circuit operations of the shift register circuit 200 regarding the intervals A11, A12, Ax1, A13 and Ay1 shown in FIG. 3, and for the sake of brevity, further similar discussion thereof is omitted. During the interval B14 of the Jth frame time, since the ninth transistor 881, the tenth transistor 882 and the eleventh transistor 883 are turned on by the gate signal SGn+2 provided by the (M+1)th shift register stage 812, the driving control voltage VQn, the gate signal SGn and the gate signal SGn+1 are then pulled down to the low power voltage Vss. That is, as shown in FIG. 9, the driving control voltage VQn is pulled down to low voltage level since the interval B14 rather than the interval B15. Regarding the other time of the Jth frame time after the interval B14, with the purpose of retaining the low voltage levels of the gate signal SGn and the gate signal SGn+1, the first pull-down control signal SC1 is employed to continuously or periodically pull down the driving control voltage VQn, the gate signal SGn and the gate signal SGn+1. In other words, the gate signal SGn+3 having high voltage level during the interval B15 has no effect on the circuit operation of Mth shift register stage 811.

Figure 10:
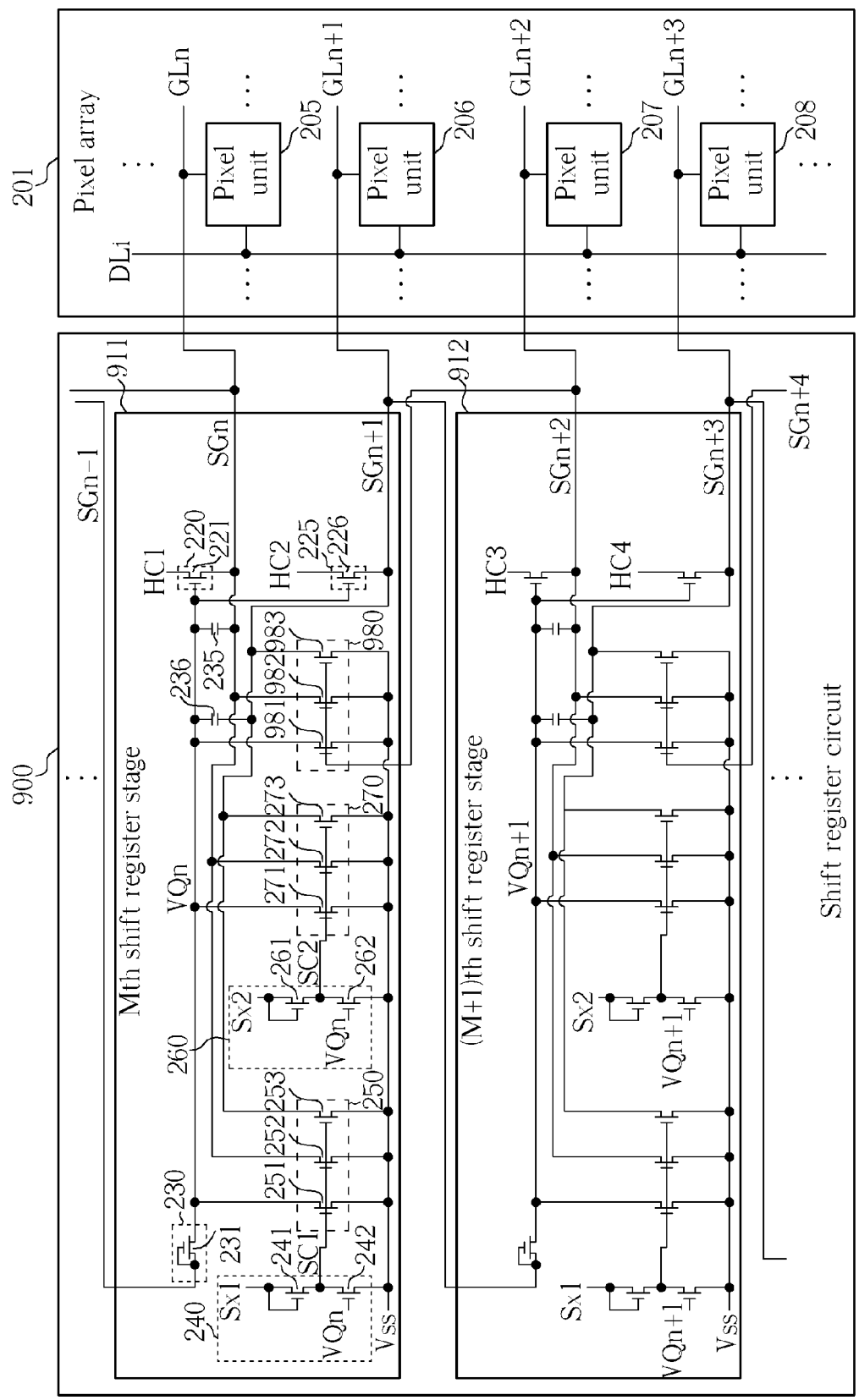
FIG. 10 is a schematic diagram showing a shift register circuit in accordance with a fourth embodiment of the present invention.

FIG. 10 is a schematic diagram showing a shift register circuit 900 in accordance with a fourth embodiment of the present invention. As shown in FIG. 10, the shift register circuit 900 comprises a plurality of shift register stages. And for ease of explanation, the shift register circuit 900 illustrates an Mth shift register stage 911 and an (M+1)th shift register stage 912. The circuit structure of the Mth shift register stage 911 is similar to that of the Mth shift register stage 511 shown in FIG. 5, differing in that the auxiliary pull-down unit 280 is replaced with an auxiliary pull-down unit 980. The auxiliary pull-down unit 980, electrically connected to the (M+1)th shift register stage 912, the input unit 230, the gate line GLn and the gate line GLn+1, is used to pull down the driving control voltage VQn, the gate signal SGn and the gate signal SGn+1 according to the gate signal SGn+2. The auxiliary pull-down unit 980 comprises a ninth transistor 981, a tenth transistor 982 and an eleventh transistor 983, which are thin film transistors, MOS field effect transistors or junction field effect transistors.

The ninth transistor 981 comprises a first end electrically connected to the second end of the third transistor 231, a gate end electrically connected to the (M+1)th shift register stage 912 for receiving the gate signal SGn+2, and a second end for receiving the low power voltage Vss. The tenth transistor 982 comprises a first end electrically connected to the gate line GLn, a gate end electrically connected to the gate end of the ninth transistor 981, and a second end for receiving the low power voltage Vss. The eleventh transistor 983 comprises a first end electrically connected to the gate line GLn+1, a gate end electrically connected to the gate end of the ninth transistor 981, and a second end for receiving the low power voltage Vss.

Regarding the circuit structure of the Mth shift register stage 911 for generating the gate signal SGn and the gate signal SGn+1, the input unit 230, the first control unit 240, the first pull down unit 250, the second control unit 260, the second pull-down unit 270 and the auxiliary pull-down unit 980 are shared to perform related pull-down operations on the gate signal SGn and the gate signal SGn+1. That is, compared with the prior-art shift register circuit, the circuit structure of the shift register circuit 900 is also significantly simplified to bring the cost down.

Figure 11:
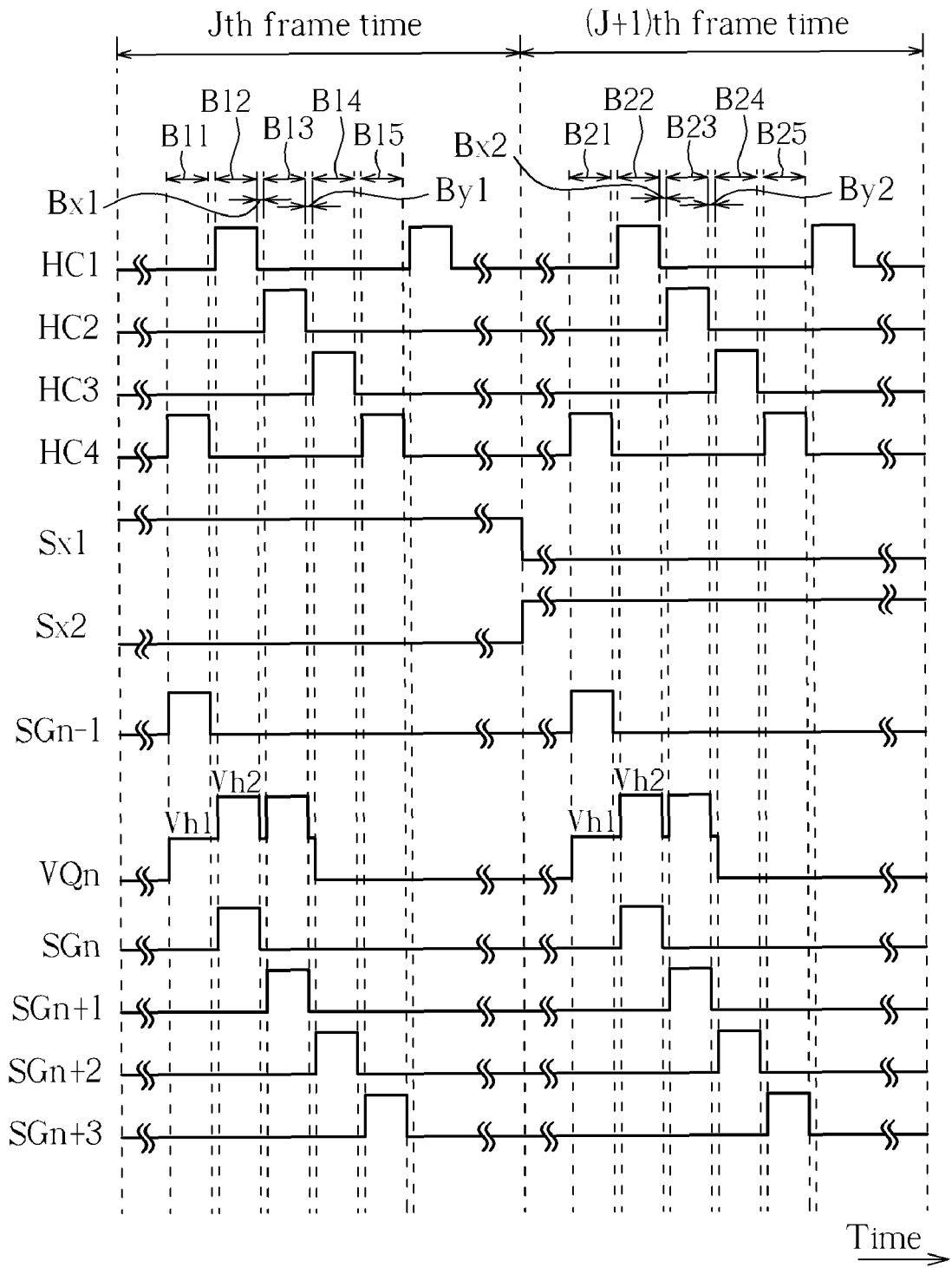
FIG. 11 is a schematic diagram showing related signal waveforms regarding a preferred circuit operation case of the shift register circuit shown in FIG. 10, having time along the abscissa.

FIG. 11 is a schematic diagram showing related signal waveforms regarding a preferred circuit operation case of the shift register circuit 900 shown in FIG. 10, having time along the abscissa. The signal waveforms in FIG. 11, from top to bottom, are the first clock signal HC1, the second clock signal HC2, the third clock signal HC3, the fourth clock signal HC4, the first control signal Sx1, the second control signal Sx2, the gate signal SGn−1, the driving control voltage VQn, the gate signal SGn, the gate signal SGn+1, the gate signal SGn+2 and the gate signal SGn+3. As shown in FIG. 11, the periodical pulses of the first clock signal HC1 through the fourth clock signal HC4 are non-overlapped to each other. In the preferred circuit operation case of the shift register circuit 900, the first control signal Sx1 and the second control signal Sx2 differ in phase by 180 degrees and each period thereof include two frame times. The circuit operations of the shift register circuit 900 regarding the intervals B11, B12, Bx1, B13, By1, B21, B22, Bx2, B23 and By2 of Jth and (J+1)th frame times are similar to the aforementioned circuit operations of the shift register circuit 500 regarding the intervals A11, A12, Ax1, A13, Ay1, A21, A22, Ax2, A23, Ay2 shown in FIG. 6, and for the sake of brevity, further similar discussion thereof is omitted.

During the interval B14 of the Jth frame time, since the ninth transistor 981, the tenth transistor 982 and the eleventh transistor 983 are turned on by the gate signal SGn+2 provided by the (M+1)th shift register stage 912, the driving control voltage VQn, the gate signal SGn and the gate signal SGn+1 are then pulled down to the low power voltage Vss. That is, as shown in FIG. 9, the driving control voltage VQn is pulled down to low voltage level since the interval B14 rather than the interval B15. Regarding the other time of the Jth frame time after the interval B14, with the purpose of retaining the low voltage levels of the gate signal SGn and the gate signal SGn+1, the first pull-down control signal SC1 having high voltage level is employed to continuously pull down the driving control voltage VQn, the gate signal SGn and the gate signal SGn+1.

During the interval B24 of the (J+1)th frame time, since the ninth transistor 981, the tenth transistor 982 and the eleventh transistor 983 are turned on by the gate signal SGn+2 provided by the (M+1)th shift register stage 912, the driving control voltage VQn, the gate signal SGn and the gate signal SGn+1 are then pulled down to the low power voltage Vss. That is, as shown in FIG. 9, the driving control voltage VQn is pulled down to low voltage level since the interval B24 rather than the interval B25. Regarding the other time of the (J+1)th frame time after the interval B24, with the purpose of retaining the low voltage levels of the gate signal SGn and the gate signal SGn+1, the second pull-down control signal SC2 having high voltage level is employed to continuously pull down the driving control voltage VQn, the gate signal SGn and the gate signal SGn+1. In other words, the gate signal SGn+3 having high voltage level during the intervals B15 and B25 has no effect on the circuit operation of Mth shift register stage 911.

Figure 12:
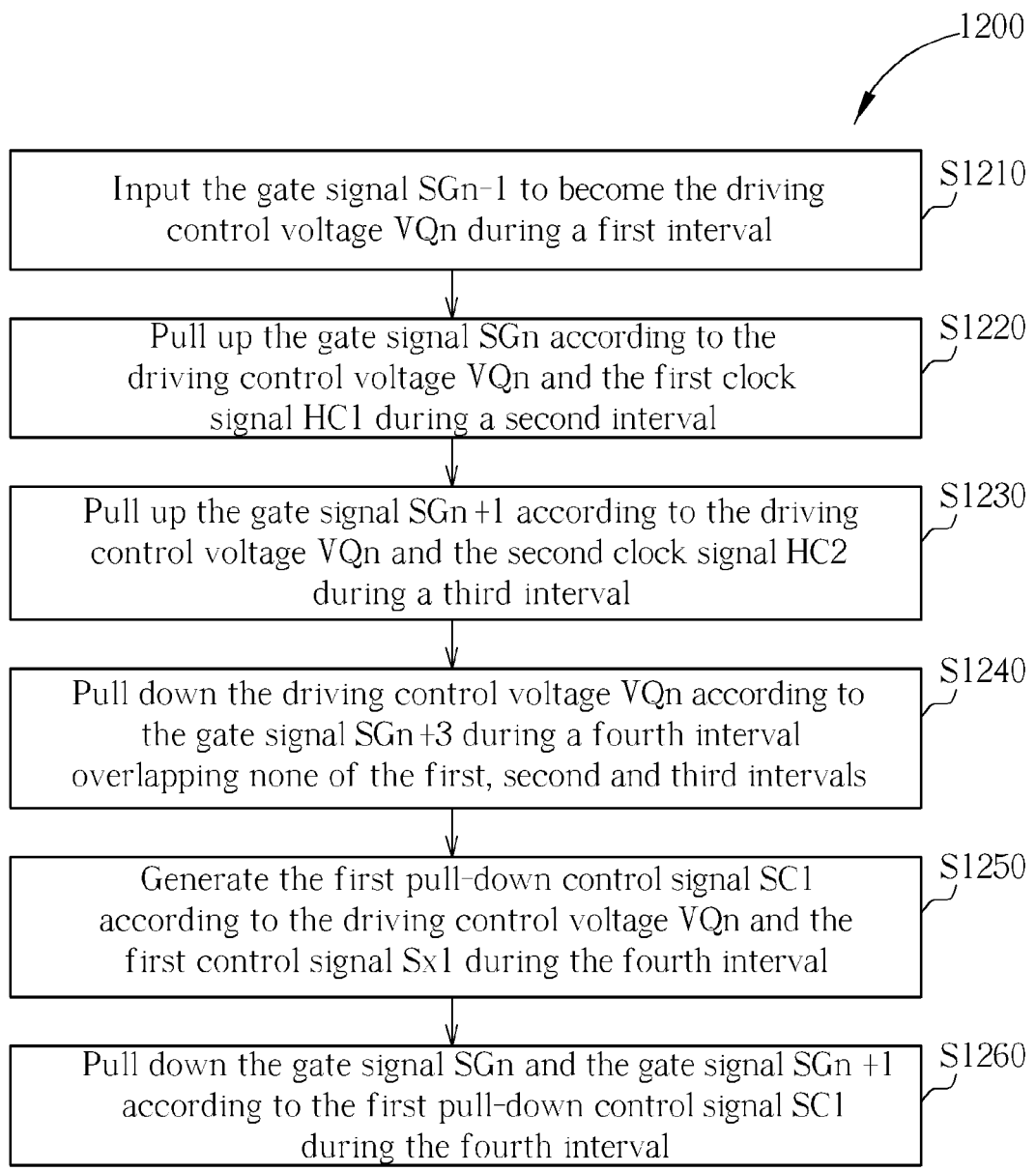
FIG. 12 is a flowchart depicting a gate signal generation method according to the present invention.

FIG. 12 is a flowchart depicting a gate signal generation method according to the present invention. The gate signal generation method regarding the flow 1200 shown in FIG. 12 is implemented based on the Mth shift register stage 211 of the shift register circuit 200 shown in FIG. 2. The flow 1200 of the gate signal generation method comprises the following steps:

Step S1210: The input unit 230 inputs the gate signal SGn−1 generated by the (M−1)th shift register stage to become the driving control voltage VQn during a first interval.

Step S1220: The first pull-up unit 220 makes use of the driving control voltage VQn and the first clock signal HC1 for pulling up the gate signal SGn furnished to the gate line GLn during a second interval.

Step S1230: The second pull-up unit 225 makes use of the driving control voltage VQn and the second clock signal HC2 for pulling up the gate signal SGn+1 furnished to the gate line GLn+1 during a third interval.

Step S1240: The auxiliary pull-down unit 280 pulls down the driving control voltage VQn according to the gate signal SGn+3 generated by the (M+1)th shift register stage 212 during a fourth interval. The fourth interval overlaps none of the first, second and third intervals.

Step S1250: The first control unit 240 makes use of the driving control voltage VQn and the first control signal Sx1 for generating the first pull-down control signal SC1 furnished to the first pull-down unit 250 during the fourth interval.

Step S1260: The first pull-down unit 250 pulls down the gate signal SGn and the gate signal SGn+1 according to the first pull-down control signal SC1 during the fourth interval.

In one embodiment, the first, second and third intervals are staggered to each other, i.e. the first, second and third intervals are non-overlapped to each other. In another embodiment, the first and second intervals are partly overlapped and the second and third intervals are partly overlapped. The step S1240 may further comprise a process that the auxiliary pull-down unit 280 pulls down the gate signal SGn and the gate signal SGn+1 according to the gate signal SGn+3. And the step S1260 may further comprise a process that the first pull-down unit 250 pulls down the driving control voltage VQn according to the first pull-down control signal SC1. Besides, if the gate signal SGn+3 mentioned in step S1240 is replaced with the gate signal SGn+2, the gate signal generation method disclosed in the flow 1200 can be applied to the shift register circuit 800 shown in FIG. 8.

Figure 13:
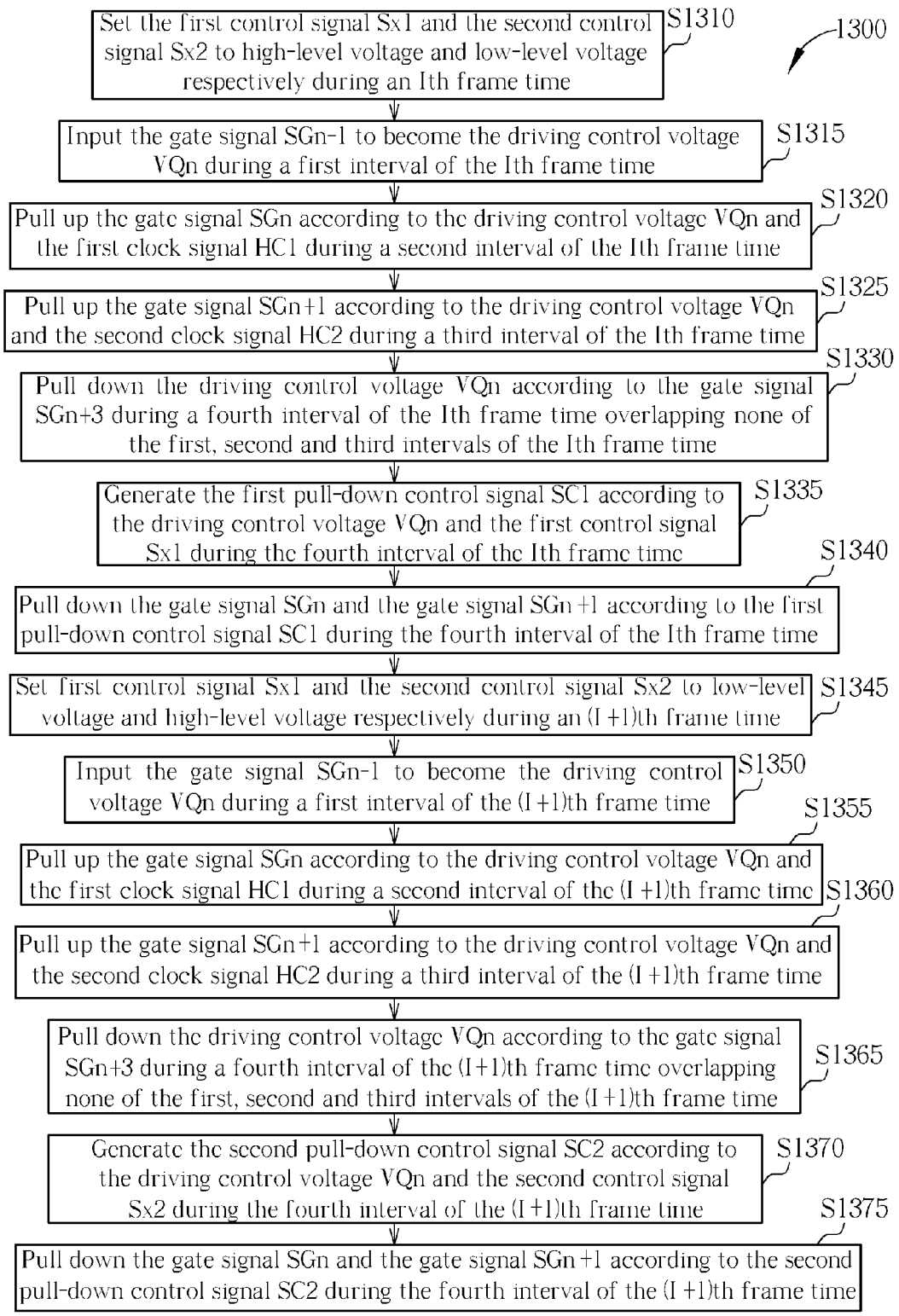
FIG. 13 is a flowchart depicting another gate signal generation method according to the present invention.

FIG. 13 is a flowchart depicting another gate signal generation method according to the present invention. The gate signal generation method regarding the flow 1300 shown in FIG. 13 is implemented based on the Mth shift register stage 511 of the shift register circuit 500 shown in FIG. 5. The flow 1300 of the gate signal generation method comprises the following steps:

Step S1310: The first control signal Sx1 and the second control signal Sx2 are set to high voltage level and low voltage level respectively during an Ith frame time.

Step S1315: The input unit 230 inputs the gate signal SGn−1 generated by the (M−1)th shift register stage to become the driving control voltage VQn during a first interval of the Ith frame time.

Step S1320: The first pull-up unit 220 makes use of the driving control voltage VQn and the first clock signal HC1 for pulling up the gate signal SGn furnished to the gate line GLn during a second interval of the Ith frame time.

Step S1325: The second pull-up unit 225 makes use of the driving control voltage VQn and the second clock signal HC2 for pulling up the gate signal SGn+1 furnished to the gate line GLn+1 during a third interval of the Ith frame time.

Step S1330: The auxiliary pull-down unit 280 pulls down the driving control voltage VQn according to the gate signal SGn+3 generated by the (M+1)th shift register stage 512 during a fourth interval of the Ith frame time. The fourth interval of the Ith frame time overlaps none of the first, second and third intervals of the Ith frame time.

Step S1335: The first control unit 240 makes use of the driving control voltage VQn and the first control signal Sx1 for generating the first pull-down control signal SC1 furnished to the first pull-down unit 250 during the fourth interval of the Ith frame time.

Step S1340: The first pull-down unit 250 pulls down the gate signal SGn and the gate signal SGn+1 according to the first pull-down control signal SC1 during the fourth interval of the Ith frame time.

Step S1345: The first control signal Sx1 and the second control signal Sx2 are set to low voltage level and high voltage level respectively during an (I+1)th frame time.

Step S1350: The input unit 230 inputs the gate signal SGn−1 to become the driving control voltage VQn during a first interval of the (I+1)th frame time.

Step S1355: The first pull-up unit 220 makes use of the driving control voltage VQn and the first clock signal HC1 for pulling up the gate signal SGn during a second interval of the (I+1)th frame time.

Step S1360: The second pull-up unit 225 makes use of the driving control voltage VQn and the second clock signal HC2 for pulling up the gate signal SGn+1 during a third interval of the (I+1)th frame time.

Step S1365: The auxiliary pull-down unit 280 pulls down the driving control voltage VQn according to the gate signal SGn+3 during a fourth interval of the (I+1)th frame time. The fourth interval of the (I+1)th frame time overlaps none of the first, second and third intervals of the (I+1)th frame time.

Step S1370: The second control unit 260 makes use of the driving control voltage VQn and the second control signal Sx2 for generating the second pull-down control signal SC2 furnished to the second pull-down unit 270 during the fourth interval of the (I+1)th frame time.

Step S1340: The second pull-down unit 270 pulls down the gate signal SGn and the gate signal SGn+1 according to the second pull-down control signal SC2 during the fourth interval of the (I+1)th frame time.

In one embodiment, the first, second and third intervals of the Ith frame time are staggered to each other and the first, second and third intervals of the (I+1)th frame time are also staggered to each other, i.e. the first, second and third intervals of the Ith frame time are non-overlapped to each other and the first, second and third intervals of the (I+1)th frame time are also non-overlapped to each other. In another embodiment, the first and second intervals of the Ith frame time are partly overlapped, the second and third intervals of the Ith frame time are partly overlapped, the first and second intervals of the (I+1)th frame time are partly overlapped, and the second and third intervals of the (I+1)th frame time are partly overlapped. Both the steps S1330 and S1365 may further comprise a process that the auxiliary pull-down unit 280 pulls down the gate signal SGn and the gate signal SGn+1 according to the gate signal SGn+3. The step S1340 may further comprise a process that the first pull-down unit 250 pulls down the driving control voltage VQn according to the first pull-down control signal SC1. And the step S1375 may further comprise a process that the second pull-down unit 270 pulls down the driving control voltage VQn according to the second pull-down control signal SC2. Besides, if the gate signal SGn+3 mentioned in steps S1330, S1365 is replaced with the gate signal SGn+2, the gate signal generation method disclosed in the flow 1300 can be applied to the shift register circuit 900 shown in FIG. 10.

In conclusion, according to the present invention, each shift register stage of the shift register circuit is employed to provide two gate signals. And regarding the circuit structure of each shift register stage for generating the two gate signals, the input unit, the control unit, the pull down unit and the auxiliary pull-down unit are shared to perform related pull-down operations on the two gate signals. That is, compared with the prior-art shift register circuit, the circuit structure of the shift register circuit according to the present invention is significantly simplified to bring the cost down. Besides, regarding the gate signal generation method for use in the shift register circuit of the present invention, the pulses of the clock signals used can be non-overlapped or partly overlapped, the shift register circuit is therefore easier to be driven for generating required gate signals.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. A shift register circuit for providing plural gate signals to plural gate lines, the shift register circuit comprising a plurality of shift register stages, an Mth shift register stage of the shift register stages comprising:
    an input unit, electrically connected to an (M−1)th shift register stage of the shift register stages for receiving an (N−1)th gate signal, for inputting the (N−1)th gate signal having high voltage level to become a driving control voltage;
    a first pull-up unit, electrically connected to the input unit and an Nth gate line of the gate lines, for pulling up an Nth gate signal of the gate signals according to the driving control voltage and a first clock signal, wherein the Nth gate line is employed to deliver the Nth gate signal;
    a second pull-up unit, electrically connected to the input unit and an (N+1)th gate line of the gate lines, for pulling up an (N+1)th gate signal of the gate signals according to the driving control voltage and a second clock signal, wherein the (N+1)th gate line is employed to deliver the (N+1)th gate signal;
    a first control unit, electrically connected to the input unit, for generating a first pull-down control signal according to the driving control voltage and a first control signal;
    a first pull-down unit, electrically connected to the first control unit, the input unit, the Nth gate line and the (N+1)th gate line, for pulling down the driving control voltage, the Nth gate signal and the (N+1)th gate signal according to the first pull-down control signal; and
    an auxiliary pull-down unit, electrically connected to the input unit, the Nth gate line, the (N+1)th gate line and an (M+1)th shift register stage, for pulling down the driving control voltage, the Nth gate line and the (N+1)th gate line according to a gate signal generated by the (M+1)th shift register stage;
    wherein M and N are positive integers.

2. The shift register circuit of claim 1, wherein the Mth shift register stage further comprises:
    a capacitor, electrically connected between the input unit and the Nth gate line, for storing the driving control voltage.

3. The shift register circuit of claim 1, wherein the Mth shift register stage further comprises:
    a capacitor, electrically connected between the input unit and the (N+1)th gate line, for storing the driving control voltage.

4. The shift register circuit of claim 1, wherein the first pull-up unit comprises a transistor, the transistor comprising:
    a first end for receiving the first clock signal;
    a gate end electrically connected to the input unit for receiving the driving control voltage; and
    a second end electrically connected to the Nth gate line.

5. The shift register circuit of claim 1, wherein the second pull-up unit comprises a transistor, the transistor comprising:
    a first end for receiving the second clock signal;
    a gate end electrically connected to the input unit for receiving the driving control voltage; and
    a second end electrically connected to the (N+1)th gate line.

6. The shift register circuit of claim 1, wherein the input unit comprises a transistor, the transistor comprising:
    a first end electrically connected to the (M−1)th shift register stage for receiving the (N-1)th gate signal;
    a gate end electrically connected to the first end of the transistor; and
    a second end electrically connected to the first and second pull-up units.

7. The shift register circuit of claim 1, wherein the first control unit comprises:
    a first transistor comprising:
        a first end for receiving the first control signal;
        a gate end electrically connected to the first end of the first transistor; and
        a second end, electrically connected to the first pull-down unit, for outputting the first pull-down control signal; and
    a second transistor comprising:
        a first end electrically connected to the second end of the first transistor;
        a gate end electrically connected to the input unit for receiving the driving control voltage; and
        a second end for receiving a low power voltage.

8. The shift register circuit of claim 1, wherein the first pull-down unit comprises:
    a first transistor for pulling down the driving control voltage according to the first pull-down control signal, the first transistor comprising:
        a first end electrically connected to the input unit;
        a gate end electrically connected to the first control unit for receiving the first pull-down control signal; and
        a second end for receiving a low power voltage;
    a second transistor for pulling down the Nth gate signal according to the first pull-down control signal, the second transistor comprising:
        a first end electrically connected to the Nth gate line;
        a gate end electrically connected to the gate end of the first transistor; and
        a second end for receiving the low power voltage; and a third transistor for pulling down the (N+1)th gate signal according to the first pull-down control signal, the third transistor comprising:
   a first end electrically connected to the (N+1)th gate line;
   a gate end electrically connected to the gate end of the first transistor; and
   a second end for receiving the low power voltage.

9. The shift register circuit of claim 1, wherein the auxiliary pull-down unit comprises:
   a first transistor for pulling down the driving control voltage according to the gate signal generated by the (M+1)th shift register stage, the first transistor comprising:
     a first end electrically connected to the input unit;
     a gate end electrically connected to the (M+1)th shift register stage for receiving the gate signal generated by the (M+1)th shift register stage; and
     a second end for receiving a low power voltage;
   a second transistor for pulling down the Nth gate signal according to the gate signal generated by the (M+1)th shift register stage, the second transistor comprising:
     a first end electrically connected to the Nth gate line;
     a gate end electrically connected to the gate end of the first transistor; and
     a second end for receiving the low power voltage; and
   a third transistor for pulling down the (N+1)th gate signal according to the gate signal generated by the (M+1)th shift register stage, the third transistor comprising:
     a first end electrically connected to the (N+1)th gate line;
     a gate end electrically connected to the gate end of the first transistor; and
     a second end for receiving the low power voltage.

10. The shift register circuit of claim 1, wherein the Mth shift register stage further comprises:
   a second unit, electrically connected to the input unit, for generating a second pull-down control unit according to the driving control voltage and a second control signal having a phase opposite to the first control signal; and
   a second pull-down unit, electrically connected to the second control unit, the input unit, the Nth gate signal and the (N+1)th gate signal, for pulling down the driving control voltage, the Nth gate signal and the (N+1)th gate signal according to the second pull-down control signal.

11. The shift register circuit of claim 10, wherein the second control unit comprises:
   a first transistor comprising:
     a first end for receiving the second control signal;
     a gate end electrically connected to the first end of the first transistor; and
     a second end, electrically connected to the second pull-down unit, for outputting the second pull-down control signal; and
   a second transistor comprising:
     a first end electrically connected to the second end of the first transistor;
     a gate end electrically connected to the input unit for receiving the driving control voltage; and
     a second end for receiving a low power voltage.

12. The shift register circuit of claim 10, wherein the second pull-down unit comprises:
   a first transistor for pulling down the driving control voltage according to the second pull-down control signal, the first transistor comprising:
     a first end electrically connected to the input unit;
     a gate end electrically connected to the second control unit for receiving the second pull-down control signal; and
     a second end for receiving a low power voltage;
   a second transistor for pulling down the Nth gate signal according to the second pull-down control signal, the second transistor comprising:
     a first end electrically connected to the Nth gate line;
     a gate end electrically connected to the gate end of the first transistor; and
     a second end for receiving the low power voltage; and
   a third transistor for pulling down the (N+1)th gate signal according to the second pull-down control signal, the third transistor comprising:
     a first end electrically connected to the (N+1)th gate line;
     a gate end electrically connected to the gate end of the first transistor; and
     a second end for receiving the low power voltage.

13. The shift register circuit of claim 1, wherein the gate signal generated by the (M+1)th shift register stage is an (N+3)th gate signal generated by the (M+1)th shift register stage.

14. The shift register circuit of claim 1, wherein the gate signal generated by the (M+1)th shift register stage is an (N+2)th gate signal generated by the (M+1)th shift register stage.

15. A gate signal generation method for generating plural gate signals furnished to plural gate lines, the gate signal generation method comprising:
   providing a shift register circuit comprising a plurality of shift register stages, an Mth shift register stage of the shift register stages comprising:
     an input unit electrically connected to an (M−1)th shift register stage of the shift register stages;
     a first pull-up unit electrically connected to the input unit and an Nth gate line of the gate lines;
     a second pull-up unit electrically connected to the input unit and an (N+1)th gate line of the gate lines;
     a control unit electrically connected to the input unit;
     a pull-down unit electrically connected the control unit, the input unit, the Nth gate line and the (N+1)th gate line; and
     an auxiliary pull-down unit electrically connected to an (M+1)th shift register stage of the shift register stages, the input unit, the Nth gate line and the (N+1)th gate line;
   the input unit inputting an (N−1)th gate signal generated by the (M−1)th shift register stage to become a driving control voltage during a first interval;
   the first pull-up unit pulling up an Nth gate signal furnished to the Nth gate line according to the driving control voltage and a first clock signal during a second interval;
   the second pull-up unit pulling up an (N+1)th gate signal furnished to the (N+1)th gate line according to the driving control voltage and a second clock signal during a third interval;
   the auxiliary pull-down unit pulling down the driving control voltage according to a gate signal generated by the (M+1)th shift register stage during a fourth interval, wherein the fourth interval overlaps none of the first, second and third intervals;
   the control unit generating a pull-down control signal furnished to the pull-down unit according to the driving control voltage and a control signal during the fourth interval; and
   the pull-down unit pulling down the Nth gate signal and the (N+1)th gate signal according to the pull-down control signal during the fourth interval.

16. The gate signal generation method of claim 15, wherein the first, second and third intervals are staggered to each other.

17. The gate signal generation method of claim 15, wherein the first and second intervals are partly overlapped and the second and third intervals are partly overlapped.

18. The gate signal generation method of claim 15, further comprising:
the auxiliary pull-down unit pulling down the Nth gate signal and the (N+1)th gate signal according to the gate signal generated by the (M+1)th shift register stage during the fourth interval; and
the pull-down unit pulling down the driving control voltage according to the pull-down control signal during the fourth interval.

19. The gate signal generation method of claim 15, wherein the control signal is the first clock signal, the second clock signal, a third clock signal or a dc voltage.

20. The gate signal generation method of claim 15, wherein the gate signal generated by the (M+1)th shift register stage is an (N+3)th gate signal generated by the (M+1)th shift register stage.

21. The gate signal generation method of claim 15 wherein, the gate signal generated by the (M+1)th shift register stage is an (N+2)th gate signal generated by the (M+1)th shift register stage.

22. A gate signal generation method for generating plural gate signals furnished to plural gate lines, the gate signal generation method comprising:
providing a shift register circuit comprising a plurality of shift register stages, an Mth shift register stage of the shift register stages comprising:
an input unit electrically connected to an (M−1)th shift register stage of the shift register stages;
a first pull-up unit electrically connected to the input unit and an Nth gate line of the gate lines;
a second pull-up unit electrically connected to the input unit and an (N+1)th gate line of the gate lines;
a first control unit electrically connected to the input unit;
a first pull-down unit electrically connected the first control unit, the input unit, the Nth gate line and the (N+1)th gate line;
a second control unit electrically connected to the input unit;
a second pull-down unit electrically connected the second control unit, the input unit, the Nth gate line and the (N+1)th gate line; and
an auxiliary pull-down unit electrically connected to an (M+1)th shift register stage of the shift register stages, the input unit, the Nth gate line and the (N+1)th gate line;
the input unit inputting an (N−1)th gate signal generated by the (M−1)th shift register stage to become a driving control voltage during a first interval of an Ith frame time;
the first pull-up unit pulling up an Nth gate signal furnished to the Nth gate line according to the driving control voltage and a first clock signal during a second interval of the Ith frame time;
the second pull-up unit pulling up an (N+1)th gate signal furnished to the (N+1)th gate line according to the driving control voltage and a second clock signal during a third interval of the Ith frame time;
the auxiliary pull-down unit pulling down the driving control voltage, the Nth gate signal and the (N+1)th gate signal according to a gate signal generated by the (M+1)th shift register stage during a fourth interval of the Ith frame time, wherein the fourth interval of the Ith frame time overlaps none of the first, second and third intervals of the Ith frame time;
the first control unit generating a first pull-down control signal furnished to the first pull-down unit according to the driving control voltage and a first control signal during the fourth interval of the Ith frame time;
the first pull-down unit pulling down the driving control voltage, the Nth gate signal and the (N+1)th gate signal according to the first pull-down control signal during the fourth interval of the Ith frame time;
the input unit inputting the (N−1)th gate signal generated by the (M−1)th shift register stage to become the driving control voltage during a first interval of an (I+1)th frame time;
the first pull-up unit pulling up the Nth gate signal according to the driving control voltage and the first clock signal during a second interval of the (I+1)th frame time;
the second pull-up unit pulling up the (N+1)th gate signal furnished to the (N+1)th gate line according to the driving control voltage and the second clock signal during a third interval of the (I+1)th frame time;
the auxiliary pull-down unit pulling down the driving control voltage, the Nth gate signal and the (N+1)th gate signal according to the gate signal generated by the (M+1)th shift register stage during a fourth interval of the (I+1)th frame time, wherein the fourth interval of the (I+1)th frame time overlaps none of the first, second and third intervals of the (I+1)th frame time;
the second control unit generating a second pull-down control signal furnished to the second pull-down unit according to the driving control voltage and a second control signal having a phase opposite to the first control signal during the fourth interval of the (I+1)th frame time; and
the second pull-down unit pulling down the driving control voltage, the Nth gate signal and the (N+1)th gate signal according to the second pull-down control signal during the fourth interval of the (I+1)th frame time.

23. The gate signal generation method of claim 22, wherein the first, second and third intervals of the Ith frame time are staggered to each other and the first, second and third intervals of the (I+1)th frame time are staggered to each other.

24. The gate signal generation method of claim 22, wherein the first and second intervals of the Ith frame time are partly overlapped, the second and third intervals of the Ith frame time are partly overlapped, the first and second intervals of the (I+1)th frame time are partly overlapped, and the second and third intervals of the (I+1)th frame time are partly overlapped.

25. The gate signal generation method of claim 22, wherein the gate signal generated by the (M+1)th shift register stage is an (N+3)th gate signal generated by the (M+1)th shift register stage.

26. The gate signal generation method of claim 22, wherein the gate signal generated by the (M+1)th shift register stage is an (N+2)th gate signal generated by the (M+1)th shift register stage.

* * * * *